(12) United States Patent
Shin et al.

(10) Patent No.: US 11,069,681 B2
(45) Date of Patent: Jul. 20, 2021

(54) INTEGRATED CIRCUIT DEVICE

(71) Applicant: Samsung Electronics Co., Ltd., Suwon-si (KR)

(72) Inventors: Keomyoung Shin, Seoul (KR); Pankwi Park, Incheon (KR); Seunghun Lee, Hwaseong (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/694,706

(22) Filed: Nov. 25, 2019

(65) Prior Publication Data
US 2020/0365586 A1 Nov. 19, 2020

(30) Foreign Application Priority Data
May 13, 2019 (KR) .................. 10-2019-0055843

(51) Int. Cl.
| | |
|---|---|
| *H01L 27/088* | (2006.01) |
| *H01L 29/26* | (2006.01) |
| *H01L 29/78* | (2006.01) |
| *H01L 29/08* | (2006.01) |
| *H01L 29/06* | (2006.01) |

(52) U.S. Cl.
CPC ...... *H01L 27/0886* (2013.01); *H01L 29/0673* (2013.01); *H01L 29/0847* (2013.01); *H01L 29/26* (2013.01); *H01L 29/785* (2013.01)

(58) Field of Classification Search
CPC ............. H01L 27/0886; H01L 29/0673; H01L 29/1033; H01L 29/41791
See application file for complete search history.

(56) References Cited

U.S. PATENT DOCUMENTS

| | | | |
|---|---|---|---|
| 9,136,343 | B2 | 9/2015 | Pillarisetty et al. |
| 9,224,809 | B2 | 12/2015 | Li et al. |
| 9,412,816 | B2 | 8/2016 | Yang et al. |
| 9,425,293 | B1 | 8/2016 | Balakrishnan et al. |
| 9,647,098 | B2 | 5/2017 | Obradovic et al. |
| 9,818,650 | B2 | 11/2017 | Doris et al. |

(Continued)

OTHER PUBLICATIONS

Clawson "Guide to references on III-V semiconductor chemical etching" Materials Science and Engineering, 31:1-438 (2001).

(Continued)

*Primary Examiner* — Changhyun Yi
(74) *Attorney, Agent, or Firm* — Myers Bigel, P.A

(57) ABSTRACT

An integrated circuit (IC) device includes a fin-type active region extending lengthwise in a first direction, a plurality of nanosheets overlapping each other in a second direction on a fin top surface of the fin-type active region, and a source/drain region on the fin-type active region and facing the plurality of nanosheets in the first direction. The plurality of nanosheets include a first nanosheet, which is closest to the fin top surface of the fin-type active region and has a shortest length in the first direction, from among the plurality of nanosheets. The source/drain region includes a source/drain main region and a first source/drain protruding region protruding from the source/drain main region. The first source/drain protruding region protrudes from the source/drain main region toward the first nanosheet and overlaps portions of the plurality of nanosheets in the second direction.

19 Claims, 22 Drawing Sheets

(56) References Cited

U.S. PATENT DOCUMENTS

| | | |
|---|---|---|
| 9,825,130 B2 | 11/2017 | Kim et al. |
| 10,074,573 B2 | 9/2018 | Kim et al. |
| 10,079,303 B2 | 9/2018 | Cheng et al. |
| 10,217,816 B2 | 2/2019 | Bhuwalka et al. |
| 2017/0018479 A1 | 1/2017 | Sagong et al. |
| 2017/0256609 A1* | 9/2017 | Bhuwalka ......... H01L 29/66545 |
| 2019/0019681 A1 | 1/2019 | Wong et al. |
| 2019/0051729 A1 | 2/2019 | Zhou |

OTHER PUBLICATIONS

D'Arrigo et al "Competitive delineation of n- and p-doped Si by selective electrochemical etch" Materials Science in Semiconductor Processing, 4:93-95 (2001).

Eijkel et al A New Technology for Micromachining of Silicon: Dopant Selective HF Anodic Etching for the Realization of Low-Doped Monocrystalline Silicon Structures, IEEE EDL, 11(12):588 (1990).

Hollander "Wet Chemical Etching of Si, Si1.xGex, and Ge in HF:H2O2:CH3COOH" Journal of the Electrochemical Society, 157(6):H643-H646 (2010).

Kim, Sung-min et al "A study on selective Si0. 8Ge0. 2 etch using polysilicon etchant diluted by H2O for three-dimensional Si structure application" Samsung Electronics Co. Ltd., Abstract.

Loubet et al "Si1-xGex/Si Selective Etch with HCl for Thin Si-Channel Transistors Integration" Extended Abstracts of the 2007 International Conference on Solid State Devices and Materials, Tsukuba, pp. 716-717 (2007).

Spinella et al "Selective Etching of B-Doped Silicon: Mechanisms and Two-Dimensional Delineation of Concentration Profiles" Journal of the Electrochemical Society (1995).

\* cited by examiner

INTEGRATED CIRCUIT DEVICE

CROSS-REFERENCE TO RELATED APPLICATION

This application claims the benefit of Korean Patent Application No. 10-2019-0055843, filed on May 13, 2019, in the Korean Intellectual Property Office, the disclosure of which is incorporated herein in its entirety by reference.

BACKGROUND

Embodiments of the inventive concept relate to an integrated circuit (IC) device, and, more particularly, to an IC device including a horizontal-nanosheet field-effect transistor (hNSFET).

With the downscaling of IC devices, it may be desirable to increase the integration density of a FET on a substrate. Accordingly, an hNSFET including a plurality of horizontal nanosheets stacked on the same layout region has been developed. However, when current concentrates into a specific channel layer of a plurality of channel layers formed in the plurality of horizontal nanosheets, even if the number of stacks of a channel layer included in an hNSFET is increased, current (i.e., an on-current) flowing in a turn-on state of a transistor may not increase in proportion to the number of stacks of a channel layer.

SUMMARY

The inventive concept provides an integrated circuit (IC) device, which may reduce or minimize a deviation in the amount of current flowing through nanosheets in a turn-on state of a nanosheet field-effect transistor (FET) and may improve performance in the turn-on state thereof.

According to an aspect of the inventive concept, there is provided an IC device including a fin-type active region extending lengthwise in a first direction, a plurality of nanosheets overlapping each other in a second direction on a fin top surface of the fin-type active region, and a source/drain region on the fin-type active region and facing the plurality of nanosheets in the first direction. The plurality of nanosheets include a first nanosheet, which is closest to the fin top surface of the fin-type active region and has a shortest length in the first direction, from among the plurality of nanosheets. The source/drain region includes a source/drain main region and a first source/drain protruding region protruding from the source/drain main region. The first source/drain protruding region protrudes from the source/drain main region toward the first nanosheet and overlaps portions of the plurality of nanosheets in the second direction.

According to another aspect of the inventive concept, there is provided an IC device including a fin-type active region extending lengthwise in a first direction, a pair of nanosheet stacks, each of which includes a plurality of nanosheets overlapping each other in a second direction on the fin-type active region, and a source/drain region between the pair of nanosheet stacks on the fin-type active region. The plurality of nanosheets includes a first nanosheet, which is closest to the fin-type active region from among the plurality of nanosheets and has a shortest length in the first direction. The source/drain region includes a source/drain main region, which does not overlap the pair of nanosheet stacks in the second direction, and a pair of first source/drain protruding regions, which protrude in opposite directions from the source/drain main region toward the first nanosheet of each of the pair of nanosheet stacks.

According to another aspect of the inventive concept, there is provided an IC device including a fin-type active region extending lengthwise in a first direction, a pair of source/drain regions located on the fin-type active region, and a plurality of nanosheets between the pair of source/drain regions and overlapping each other in a second direction on the fin-type active region. The plurality of nanosheets includes a first nanosheet and a second nanosheet having different lengths in the first direction. Each of the pair of source/drain regions includes at least one source/drain protruding region protruding toward the plurality of nanosheets.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
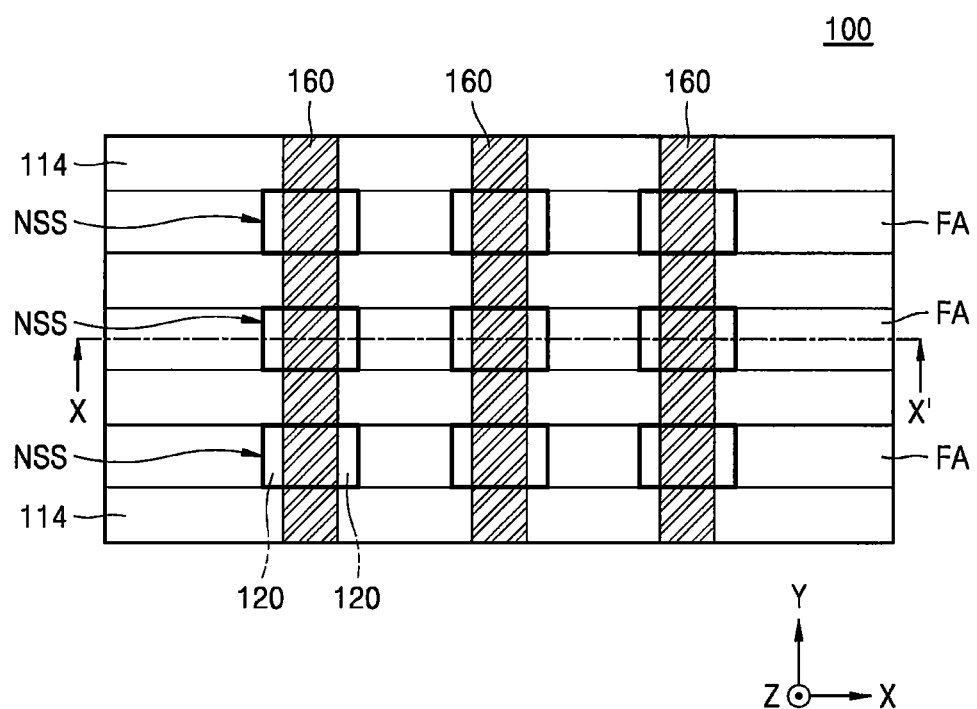
FIG. 1 illustrates a plan layout of some components of an integrated circuit (IC) device according to some embodiments of the inventive concept.

Embodiments of the inventive concept will now be described with reference to the accompanying drawings in which some embodiments are shown. Like reference numerals in the drawings denote like elements, and, thus, descriptions thereof will be omitted. As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Some embodiments of the inventive concept stem from a realization that in a multi-bridge channel field-effect transistor (MBCFET), current may be concentrated in a top channel, which is close to a contact, due to source/drain resistance an a junction profile. As a result, increasing the number of layers in a channel stack may not result in an increase in the on-current in proportion to the increase in the number of layers in the stack. Some embodiments of the inventive concept may provide an integrated circuit device including a channel structure that has reduced variation in current flow through respective ones of a plurality of stacked nanosheets forming a channel structure. Various techniques may be used to reduce this variation in current flow, in accordance with different embodiments of the inventive concept, including, for example, engineering the bandgap of a nanosheet that is closest to an active region so as to be lower than other ones of the nanosheets in the stack and/or decreasing a length of the nanosheet that is closest to the active region relative to the other ones of the nanosheets in the stack. In other embodiments, different doping profiles and/or Ge or Ga content profiles may be used in the nanosheets to improve dispersion of current throughout the nanosheet stack.

Figure 2A:
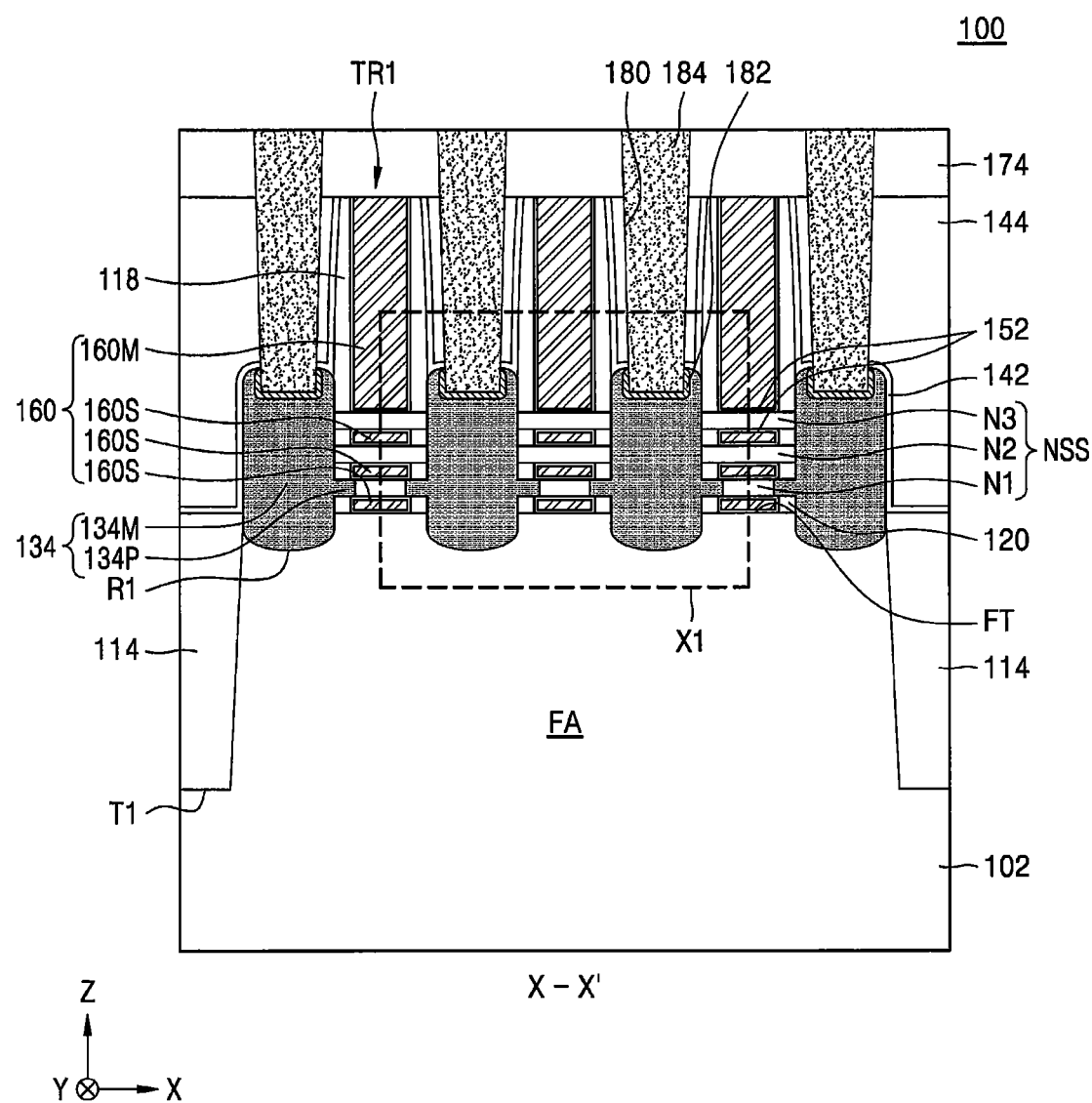
FIG. 2A is a cross-sectional view taken along a line X-X' of FIG. 1.

FIG. 1 illustrates a plan layout of some components of an integrated circuit (IC) device 100 according to some embodiments of the inventive concept. FIG. 2A is a cross-sectional view taken along a line X-X' of FIG. 1, and FIG. 2B is an enlarged cross-sectional view of a partial region X1 in FIG. 2A.

Figure 2B:
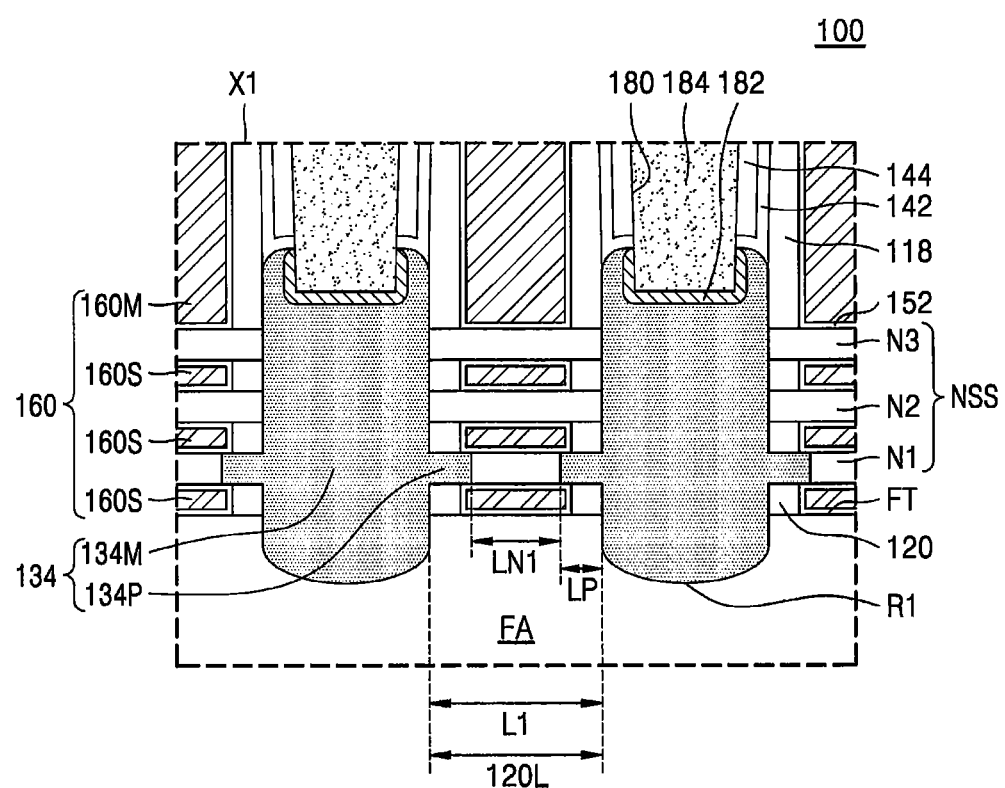
FIG. 2B is an enlarged cross-sectional view of a local region denoted by "X1" in FIG. 2A.

Referring to FIGS. 1, 2A, and 2B, the IC device 100 may include a plurality of fin-type active regions FA, which protrude from a substrate 102 and extend in a first horizontal direction (X direction), and a plurality of nanosheet stacks NSS, which are apart from the plurality of fin-type active regions FA and face fin top surfaces FT of the plurality of fin-type active regions FA. As used herein, the term "nanosheet" refers to a conductive structure having a cross-section that is substantially perpendicular to a direction in which current flows. The nanosheet may be interpreted as including nanowires.

The substrate 102 may include one or more semiconductors (e.g., silicon (Si) or germanium (Ge)) and/or one or more compound semiconductors (e.g., silicon germanium (SiGe), silicon carbide (SiC), gallium arsenide (GaAs), indium arsenide (InAs), indium gallium arsenide (InGaAs), or indium phosphide (InP)). A trench T1 may be formed in the substrate 102 to define a plurality of fin-type active regions FA and may be at least partially filled with a device isolation film 114. The device isolation film 114 may include an oxide film, a nitride film, or a combination thereof.

A plurality of gate lines 160 may be located on a plurality of fin-type active regions FA and extend in a second horizontal direction (Y direction), which intersects with the first horizontal direction (X direction). In some embodiments, the first and second horizontal directions may be perpendicular with respect to one another. The plurality of nanosheet stacks NSS may be respectively located on the fin top surfaces FT of the plurality of fin-type active regions FA at intersections between the plurality of fin-type active regions FA and the plurality of gate lines 160. The plurality of nanosheet stacks NSS may be apart from the fin-type active regions FA and face the fin top surfaces FT of the plurality of fin-type active regions FA. Each of the plurality of nanosheet stacks NSS may include a plurality of nanosheets (e.g., first to third nanosheets N1, N2, and N3), which overlap each other in a vertical direction (Z direction) on the fin top surface FT of the fin-type active region FA. The first to third nanosheets N1, N2, and N3 may have different respective distances (i.e., Z-directional distances) from the fin top surfaces FT of the fin-type active regions FA. The first nanosheet N1, the second nanosheet N2, and the third nanosheet N3 may be sequentially stacked on the fin top surface FT of the fin-type active region Fain in this stated order.

Although FIG. 1 illustrates an example in which a planar shape of the nanosheet stack NSS has a substantially tetragonal shape, embodiments of the inventive concept are not limited thereto. The nanosheet stack NSS may have various planar shapes according to a planar shape of the fin-type active region FA and a planar shape of each of the gate lines 160. The present example illustrates a case in which the plurality of nanosheet stacks NSS and the plurality of gate lines 160 are formed on one fin-type active region FA and the plurality of nanosheet stacks NSS may be located on one fin-type active region FA in a row in the first horizontal direction (X direction). However, according to some embodiments of the inventive concept, the number of nanosheet stacks NSS located on one fin-type active region FA may not be specifically limited. For example, one nanosheet stack NSS may be formed on one fin-type active region FA. The present example illustrates a case in which each of the plurality of nanosheet stacks NSS includes three nanosheets, but embodiments of the inventive concept are not limited thereto. For example, the nanosheet stack NSS may include at least two nanosheets, and the number of nanosheets included in the nanosheet stack NSS may not be specifically limited.

Each of the first to third nanosheets N1, N2, and N3 may have a channel region. In some embodiments, each of the first to third nanosheets N1, N2, and N3 may have a thickness that is selected within a range of about 4.5 nm to about 5.5 nm, but embodiments of the inventive concept are not limited thereto. Here, the thickness of each of the first to third nanosheets N1, N2, and N3 may mean a size of each of the first to third nanosheets N1, N2, and N3 in the vertical direction (Z direction). In some embodiments, the first to third nanosheets N1, N2, and N3 may have substantially the same thickness. In some other embodiments, at least some of the first to third nanosheets N1, N2, and N3 may have different thicknesses.

At least some of the first to third nanosheets N1, N2, and N3 may have different sizes in the first horizontal direction (X direction). The first nanosheet N1, which is closest to the fin top surface FT in the first horizontal direction (X direction), from among the first to third nanosheets N1, N2, and N3, may have a smallest length LN1. A length of each of the second and third nanosheets N2 and N3 may be greater than the length LN1 of the first nanosheet N1 in the first horizontal direction (X direction). In some embodiments, the second and third nanosheets N2 and N3 may have substantially the same length.

As described above, the first nanosheet N1 closest to the fin-type active region FA, from among the first to third nanosheets N1, N2, and N3, may have the smallest length LN1, and thus, an effective channel length of a channel formed in the first nanosheet N1 may be relatively reduced. Accordingly, as compared to a case in which the first nanosheet N1 has the same length as the second and third nanosheets N2 and N3, the amount of current flowing through the first nanosheet N1 may be increased at the same operating voltage. Thus, the thickness and lengths of the nanosheets N1, N2, and N3 may affect the amount of current flow therethrough with decreased thickness and increased length resulting in less current flow and increased thickness and reduced length resulting in more current flow.

A plurality of recesses R1 may be formed in upper portions of the fin-type active regions FA, and a plurality of source/drain regions 134 may be formed on the plurality of recesses R1. The plurality of source/drain regions 134 may include an epitaxially grown semiconductor layer. For example, the plurality of source/drain regions 134 may include a Group-IV semiconductor, a Group-IV compound semiconductor, or a Group III-V compound semiconductor.

The plurality of source/drain regions 134 may be doped with an n-type dopant or a p-type dopant. In some embodiments, the plurality of source/drain regions 134 may include a Si layer or a SiGe layer. In this case, the plurality of source/drain regions 134 may be doped with an n-type dopant selected from phosphorus (P), arsenic (As), and/or antimony (Sb) or a p-type dopant selected from boron (B) and/or gallium (Ga). In some other embodiments, the plurality of source/drain regions 134 may include an InGaAs layer or an InGaSb layer. In this case, the plurality of source/drain regions 134 may be doped with an n-type dopant selected from silicon (Si), sulfur (S), selenium (Se), and/or tellurium (Te).

In some embodiments, each of the plurality of source/drain regions 134 may include a plurality of semiconductor layers having different dopant concentrations. For example, each of the plurality of source/drain regions 134 may have a dopant concentration decreasing in a direction toward the fin-type active region FA and the first to third nanosheets N1, N2, and N3 and may have a dopant concentration increasing in a direction away from the fin-type active region FA and the first to third nanosheets N1, N2, and N3. In some embodiments, the dopant concentration may monotonically decrease in the direction toward the fin-type active region FA and may monotonically increase in the direction away from the fin-type active region FA.

Each of the plurality of source/drain regions 134 may include a source/drain main region 134M, which is located on the recess R1, and a source/drain protruding region 134P, which is integrally connected to the source/drain main region 134M and protrudes from the source/drain main region 134M toward the first nanosheet N1. The source/drain protruding region 134P may be in contact with the first nanosheet N1. The plurality of source/drain regions 134 may face the first to third nanosheets N1, N2, and N3 in the first horizontal direction (X direction). One source/drain region 134 may include a pair of source/drain protruding regions 134P, which respectively protrude in opposite directions toward the first nanosheet N1 of each of a pair of nanosheet stacks NSS located adjacent to each other on both sides of the one source/drain region 134. The source/drain main region 134M may not overlap a pair of nanosheet stacks NSS adjacent thereto on both sides of the source/drain region 134 in the vertical direction (Z direction) The source/drain protruding region 134P may overlap portions of the first to third nanosheets N1, N2, and N3 included in the nanosheet stack NSS in the vertical direction (Z direction).

The length LN1 of the first nanosheet N1 may be defined by two source/drain protruding regions 134P, which are respectively in contact with both sidewalls of the first nanosheet N1, in the first horizontal direction (X direction). The length LN1 of the first nanosheet N1 may be less than a maximum length L1 of the nanosheet stack NSS in the first horizontal direction (X direction). In some embodiments, a length LP of the source/drain protruding region 134P may be less than ½ of the length LN1 of the first nanosheet N1. In some embodiments, the length LN1 of the first nanosheet N1 may be at least twice the length LP of the source/drain protruding region 134P, but embodiments of the inventive concept are not limited thereto.

The gate line 160 may be located on the fin-type active region FA to at least partially cover the nanosheet stack NSS and at least partially surround each of the first to third nanosheets N1, N2, and N3. Each of the plurality of gate lines 160 may include a main gate portion 160M, which at least partially covers a top surface of the nanosheet stack NSS and extends in the second horizontal direction (Y direction), and a plurality of sub-gate portions 160S, which are integrally connected to the main gate portion 160M and respectively located one by one between the first to third nanosheets N1, N2, and N3 and between the fin-type active region FA and the first nanosheet N1. A thickness of each of the plurality of sub-gate portions 160S may be less than a thickness of the main gate portion 160M in the vertical direction (Z direction). The first to third nanosheets N1, N2, and N3 may, some embodiments, be completely surrounded by the gate line 160 in the Z direction and have a gate-all-around (GAA) structure. That is the first to third nanosheets N1, N2, and N3 are between the main gate portion 160M and the lowermost one in the Z direction relative to the substrate 102 of the plurality of sub-gate portions 160S.

The gate line 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and/or palladium (Pd). The metal nitride may be selected from titanium nitride (TiN) and/or tantalum nitride (TaN). The metal carbide may be titanium aluminum carbide (TiAlC).

A gate dielectric film 152 may be between the nanosheet stack NSS and the gate line 160. In some embodiments, the gate dielectric film 152 may include a stack structure of an interface film and a high-k dielectric film. The interface film may include a low-k dielectric material film having a dielectric constant of about 9 or lower, for example, a silicon oxide film, a silicon oxynitride film, or a combination thereof. In some embodiments, the interface film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, but embodiments of the inventive concept are not limited thereto.

A plurality of nanosheet transistors TR1 may be formed at intersections between the plurality of fin-type active regions FA and the plurality of gate lines 160 on the substrate 102. In the plurality of nanosheet transistors TR1, the first nanosheet N1 closest to the first-type active region FA, from among the first to third nanosheets N1, N2, and N3, may have the shortest length LN1 so that the effective channel length of the channel formed in the first nanosheet N1, from among the first to third nanosheets N1, N2, and N3, may be less than in other nanosheets. Thus, a resistance of the first nanosheet N1 may be relatively reduced and the amount of current flowing through the first nanosheet N1 may be increased at the same operating voltage. As a result, a deviation in the amount of current flowing through the first to third nanosheets N1, N2, and N3 may be reduced or minimized in a turn-on state of the nanosheet transistor TR1, and, thus, the performance of the IC device 100 may be improved or optimized in the turn-on state.

In some embodiments, the first to third nanosheets N1, N2, and N3 may include semiconductor layers having the same element. In an example, each of the first to third nanosheets N1, N2, and N3 may include a Si layer. In another example, each of the first to third nanosheets N1, N2, and N3 may include a SiGe layer.

In some other embodiments, the first to third nanosheets N1, N2, and N3 may include semiconductor layers including different elements. For example, the first nanosheet N1 may include a SiGe layer, and the second and third nanosheets N2 and N3 may include a Si layer.

In some other embodiments, the first to third nanosheets N1, N2, and N3 may include semiconductor layers having different dopant concentrations.

For example, the first to third nanosheets N1, N2, and N3 may include one semiconductor element selected from Group IV semiconductor elements, such as Si and Ge. In this case, the first nanosheet N1 may include a doped semiconductor layer, and the second and third nanosheets N2 and N3 may include an undoped semiconductor layer. In an example, the first nanosheet N1 may include a silicon layer doped with an n-type dopant or a p-type dopant, and the second and third nanosheets N2 and N3 may include an undoped silicon layer. For example, the first nanosheet N1 may be doped with a dopant of the same conductivity type as a conductivity type of the plurality of source/drain regions 134. In an example, the first nanosheet N1 may include a Si layer doped with an n-type dopant, the second and third nanosheets N2 and N3 may include an undoped Si layer, and the plurality of source/drain regions 134 may include a Si layer doped with an n-type dopant. In another example, the first nanosheet N1 may include a Si layer doped with a p-type dopant, the second and third nanosheets N2 and N3 may include an undoped Si layer, and the plurality of source/drain regions 134 may include a SiGe layer doped with a p-type dopant. In the Si layer doped with the n-type dopant, the n-type dopant may include phosphorus (P), arsenic (As), antimony (Sb), or a combination thereof, but embodiments of the inventive concept are not limited thereto. In the Si layer doped with the p-type dopant and the SiGe layer doped with the p-type dopant, the p-type dopant may include boron (B), gallium (Ga), or a combination thereof, but embodiments of the inventive concept are not limited thereto. For example, a dopant concentration of the Si layer may range from about $1 \times 10^{18}$ cm$^{-3}$ to about $1 \times 10^{21}$ cm$^{-3}$, but embodiments of the inventive concept are not limited thereto.

In some other embodiments, the first to third nanosheets N1, N2, and N3 may include a compound semiconductor selected from a Group-IV compound semiconductor and a Group III-V compound semiconductor. In this case, the first nanosheet N1 may include a doped compound semiconductor layer, and the second and third nanosheets N2 and N3 may include an undoped compound semiconductor layer. The Group III-V compound semiconductor may be a binary, ternary, or quaternary Group III-V compound semiconductor including two, three, or four elements selected from Group-III and Group-V semiconductors. For example, the first to third nanosheets N1, N2, and N3 may be selected from a Group-IV compound semiconductor, such as silicon germanium (SiGe), silicon carbide (SiC), silicon germanium carbide (SiGeC), germanium tin (GeSn), silicon tin (SiSn), and silicon germanium tin (SiGeSn), and a Group III-V compound semiconductor, such as indium gallium arsenide (InGaAs), indium gallium antimonide (InGaSb), indium arsenide (InAs), indium phosphide (InP), indium arsenide (InAs), gallium arsenide phosphide (GaAsP), and gallium indium phosphide (GaInP), but embodiments of the inventive concept are not limited thereto.

In an example, the first to third nanosheets N1, N2, and N3 may include a SiGe layer. In this case, the first nanosheet N1 may include a SiGe layer doped with an n-type or p-type dopant, and the second and third nanosheets N2 and N3 may include an undoped SiGe layer. A conductivity type of the doped SiGe layer may be the same as a conductivity type of the plurality of source/drain regions 134.

In another example, the first to third nanosheets N1, N2, and N3 may include an InGaAs layer. In this case, the first nanosheet N1 may include an InGaAs layer doped with an n-type or p-type dopant, and the second and third nanosheets N2 and N3 may include an undoped InGaAs layer. A conductivity type of the doped InGaAs layer may be the same as the conductivity type of the plurality of source/drain regions 134.

In another example, the first to third nanosheets N1, N2, and N3 may include an InGaSb layer. In this case, the first nanosheet N1 may include an InGaSb layer doped with an n-type or p-type dopant, and the second and third nanosheets N2 and N3 may include an undoped InGaSb layer. A conductivity type of the doped InGaSb layer may be the same as the conductivity type of the plurality of source/drain regions 134.

As in the above-described example, when the first nanosheet N1 closest to the fin-type active region FA, from among the first to third nanosheets N1, N2, and N3, includes a semiconductor layer doped with a dopant of the same conductivity type as the conductivity type of the plurality of source/drain regions 134 and the second and third nanosheets N2 and N3 include an undoped semiconductor layer, in a turn-on state of the nanosheet transistor TR1, the first nanosheet N1 may form a junctionless channel and the second and third nanosheets N2 and N3 may form p-n junction-based channels. As used herein, the term "junctionless" refers to the absence of a doped p-n junction in a channel at a boundary of the nanosheet transistor TR1. The junctionless channel may include a region having a relatively high dopant concentration and a region having a relatively low dopant concentration, which have the same conductivity type. Only the first nanosheet N1 closest to the fin-type active region FA, from among the first to third nanosheets N1, N2, and N3, may form the junctionless channel in the turn-on state of the nanosheet transistor TR1, and, thus, the amount of current flowing through the first nanosheet N1 may be increased.

In some other embodiments, the first to third nanosheets N1, N2, and N3 may include the same Group-IV compound semiconductor layer. In this case, at least some of the first to third nanosheets N1, N2, and N3 may include Group-IV compound semiconductor layers having different compositions. In an example, the first to third nanosheets N1, N2, and N3 may include $Si_{1-x}Ge_x$ (0<x<1). In this case, a Ge content ratio (value of x) of the first nanosheet N1, from among the first to third nanosheets N1, N2, and N3, may be higher than Ge content ratios (values of x) of nanosheets other than the first nanosheet N1. In another example, the first to third nanosheets N1, N2, and N3 may include $Si_{1-x}Ge_x$ (0<x<1). In this case, the Ge content ratio (value of x) may gradually increase in a direction toward the fin-type active region FA. For example, the first nanosheet N1 may include $Si_{0.55}Ge_{0.45}$, the second nanosheet N2 may include $Si_{0.65}Ge_{0.35}$, and the third nanosheet N3 may include $Si_{0.75}Ge_{0.25}$, but embodiments of the inventive concept are not limited thereto. As described above, because the first nanosheet N1, which is closest to the fin-type active region FA, from among the first to third nanosheets N1, N2, and N3, may have the highest Ge content ratio, a bandgap of the first nanosheet N1 may be lower than bandgaps of other nanosheets in the turn-on state of the plurality of nanosheet transistors TR1. Thus, in the turn-on state of the nanosheet transistor TR1, the amount of current flowing through the first nanosheet N1 closest to the fin-type active region FA, from among the first to third nanosheets N1, N2, and N3, may increase. As a result, a deviation in the amount of current flowing through the first to third nanosheets N1, N2, and N3 may be reduced or minimized in the turn-on state of the nanosheet transistor TR1, and, thus, the performance of the IC device 100 may be improved or optimized in the turn-on state.

In some other embodiments, the first to third nanosheets N1, N2, and N3 may include the same Group III-V compound semiconductor layer. In this case, at least some of the first to third nanosheets N1, N2, and N3 may include a Group III-V compound semiconductor layer having different compositions. In an example, the first to third nanosheets N1, N2, and N3 may include $In_{1-y}Ga_yAs$ (0<y<1). In this case, a Ga content ratio (value of y) of the first nanosheet N1, from among the first to third nanosheets N1, N2, and N3, may be lower than a Ga content ratio (value of y) of nanosheets other than the first nanosheet N1. Ga content ratios (values of y) of the first to third nanosheets N1, N2, and N3 may be gradually reduced in a direction toward the fin-type active region FA, while In content ratios of the first to third nanosheets N1, N2, and N3 may be gradually increased in the direction toward the fin-type active region FA. For example, the first nanosheet N1 may include $In_{0.80}Ga_{0.20}As$, the second nanosheet N2 may include $In_{0.65}Ga_{0.35}As$, and the third nanosheet N3 may include $In_{0.53}Ga_{0.47}As$, but embodiments of the inventive concept are not limited thereto.

In another example, the first to third nanosheets N1, N2, and N3 may include $In_{1-z}Ga_zSb$ (0<z<1). In this case, a Ga content ratio (value of z) of the first nanosheet N1, from among the first to third nanosheets N1, N2, and N3, may be lower than Ga content ratios (values of z) of nanosheets other than the first nanosheet N1. The Ga content ratios (values of z) of the first to third nanosheets N1, N2, and N3 may be gradually reduced in the direction toward the fin-type active region FA. For example, the first nanosheet N1 may include $In_{0.80}Ga_{0.20}Sb$, the second nanosheet N2 may include $In_{0.65}Ga_{0.35}Sb$, and the third nanosheet N3 may include $In_{0.53}Ga_{0.47}Sb$, but embodiments of the inventive concept are not limited thereto.

As in the above-described example, because the first nanosheet N1, which is closest to the fin-type active region FA from among the first to third nanosheets N1, N2, and N3, has the lowest Ga content ratio, a bandgap of the first nanosheet N1 may become lower than bandgaps of other nanosheets in the turn-on state of the plurality of nanosheet transistors TR1. Thus, in the turn-on state of the nanosheet transistor TR1, the amount of current flowing through the first nanosheet N1 closest to the fin-type active region FA, from among the first to third nanosheets N1, N2, and N3, may increase. As a result, a deviation in the amount of current flowing through the first to third nanosheets N1, N2, and N3 may be reduced or minimized in the turn-on state of the nanosheet transistor TR1, and, thus, the performance of the IC device 100 may be improved or optimized in the turn-on state.

A metal silicide film 182 may be formed on a top surface of each of the plurality of source/drain regions 134. The metal silicide film 182 may include titanium silicide, but embodiments of the inventive concept are not limited thereto. The metal silicide film 182 may be omitted.

Both sidewalls of each of the plurality of gate lines 160 may be at least partially covered by a plurality of outer insulating spacers 118. The plurality of outer insulating spacers 118 may at least partially cover both sidewalls of the main gate portions 160M on the plurality of nanosheet stacks NSS. The plurality of outer insulating spacers 118 and the plurality of source/drain regions 134 may be at least partially covered by a protective insulating film 142. Each of the outer insulating spacers 118 and the protective insulating film 142 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide ($SiO_2$), or a combination thereof. The protective insulating film 142 may be omitted in some embodiments.

A plurality of inner insulating spacers 120 may be between the first to third nanosheets N1, N2, and N3 and between the fin-type active region FA and the first nanosheet N1. Both sidewalls of each of the plurality of sub-gate portions 160S may be at least partially covered by the inner insulating spacers 120 with the gate dielectric film 152 therebetween. The plurality of inner insulating spacers 120 may be between the plurality of sub-gate portions 160S and the plurality of source/drain main regions 134M and overlap the source/drain protruding regions 134P in the vertical direction (Z direction). The source/drain protruding region 134P may be in contact with the first nanosheet N1 and define a length of the first nanosheet N1 in the first horizontal direction (X direction). In the first horizontal direction (X direction), the maximum length L1 of the nanosheet stack NSS may be substantially equal to a distance 120L between both outermost sidewalls of the inner insulating spacers 120 located on both sides of each of the plurality of sub-gate portions 160S of the gate line 160.

In some embodiments, the outer insulating spacers 118 may include the same material as the inner insulating spacers 120. In some other embodiments, the outer insulating spacers 118 may include a different material from the inner insulating spacers 120. The inner insulating spacers 120 may include SiN, SiCN, SiBN, SiON, SiOCN, SiBCN, SiOC, $SiO_2$, or a combination thereof. The inner insulating spacers 120 may further include air gaps.

An inter-gate dielectric film 144 and an interlayer insulating film 174 may be sequentially formed on the protective insulating film 142. Each of the inter-gate dielectric film 144 and the interlayer insulating film 174 may include a silicon oxide film.

A plurality of contact plugs 184 may be located inside a plurality of contact holes 180 passing through the interlayer insulating film 174, the inter-gate dielectric film 144, and the protective insulating film 142. The plurality of contact plugs 184 may be connected to the plurality of source/drain regions 134 through a plurality of metal silicide films 182. Each of the contact plugs 184 may include a metal, a conductive metal nitride, or a combination thereof. For example, each of the contact plugs 184 may include tungsten (W), copper (Cu), aluminum (Al), titanium (Ti), tantalum (Ta), titanium nitride (TiN), tantalum nitride (TaN), an alloy thereof, or a combination thereof.

In the IC device 100, because the first nanosheet N1 closest to the fin-type active region FA, from among the first to third nanosheets N1, N2, and N3, has the shortest length, the effective channel length of the channel formed in the first nanosheet N1 may be reduced. Accordingly, as compared to a case in which the first nanosheet N1 has the same length as the second and third nanosheets N2 and N3, the amount of current flowing through the first nanosheet N1 may be increased at the same operating voltage. For example, when the first nanosheet N1 includes a semiconductor layer doped with a dopant of the same conductivity type as a conductivity type of the plurality of source/drain regions 134, only the first nanosheet N1, from among the first to third nanosheets N1, N2, and N3, may be configured to selectively form the junctionless channel in the turn-on state of the nanosheet transistor TR1, and, thus, the amount of current flowing through the first nanosheet N1 may be increased. In addition, when the first to third nanosheets N1, N2, and N3 include a compound semiconductor layer including Ge or Ga, from among the first to third nanosheets N1, N2, and N3, the first nanosheet N1 may be controlled to have a highest Ge content ratio or a lowest Ga content ratio. Thus, a bandgap of the first nanosheet N1 may be controlled to be lower than bandgaps of other nanosheets in the turn-on state of the plurality of nanosheet transistors TR1, and, thus, the amount of current flowing through the first nanosheet N1 may be increased. As a result, a deviation in the amount of current flowing through the first to third nanosheets N1, N2, and N3 may be reduced or minimized in the turn-on state of the nanosheet transistor TR1, and, thus, the performance of the IC device 100 in the turn-on state may be improved or optimized.

Figure 3:
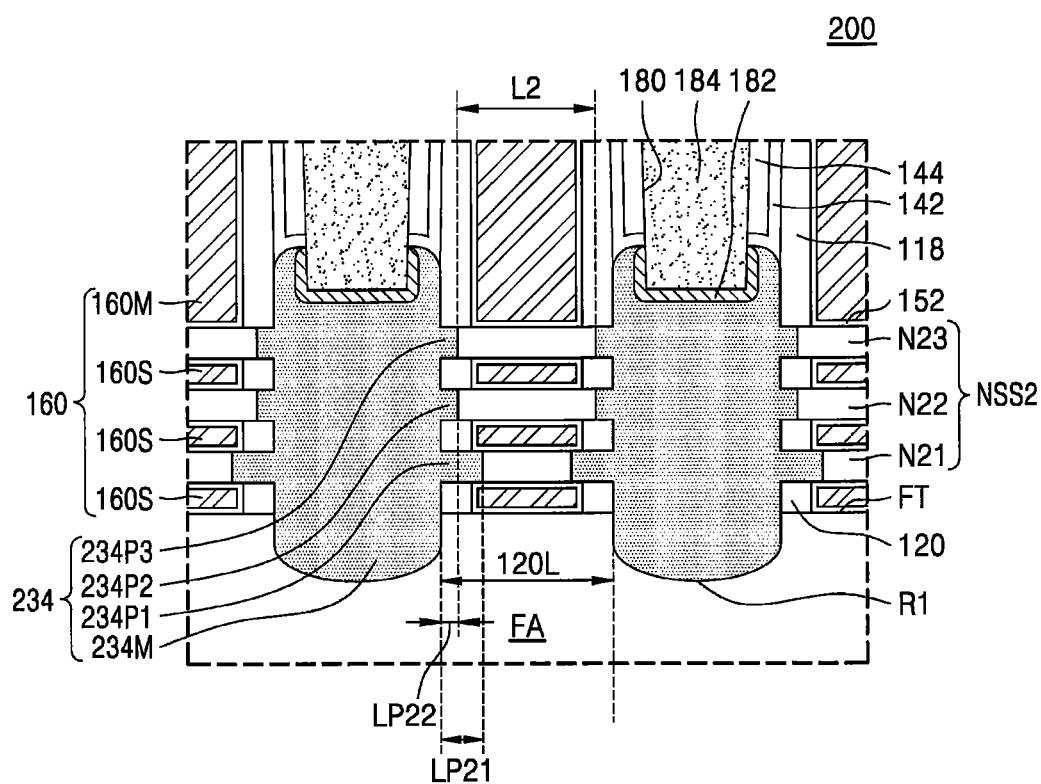
FIG. 3 is a cross-sectional view of an IC device according to some embodiments of the inventive concept, which is an enlarged cross-sectional view of a region corresponding to the partial region denoted by "X1" in FIG. 2A.

FIG. 3 is a cross-sectional view of an IC device 200 according to some embodiments of the inventive concept, which is an enlarged cross-sectional view of a region corresponding to the partial region X1 in FIG. 2A.

Referring to FIG. 3, the IC device 200 may have substantially the same configuration as the IC device 100 described with reference to FIGS. 1, 2A, and 2B. However, the IC device 200 may include a plurality of nanosheet stacks NSS2 facing fin top surfaces FT of a plurality of fin-type active regions FA. The plurality of nanosheet stacks NSS2 may include a first nanosheet N21, a second nanosheet N22, and a third nanosheet N23, which are sequentially stacked on the fin top surface FT of the fin-type active region FA. A greatest length L2 of each of the plurality of nanosheet stacks NSS2 in a first horizontal direction (X direction) may be less than a distance 120L between both outermost sidewalls of inner insulating spacers 120 located on both sides of each of a plurality of sub-gate portions 160S of a gate line 160.

The first nanosheet N21, which is closest to the fin top surface FT from among the first to third nanosheets N21, N22, and N23, may have a shortest length in the first horizontal direction (X direction), and the second and third nanosheets N22 and N23 may have substantially the same length.

The IC device 200 may include a plurality of source/drain regions 234. Each of the plurality of source/drain regions 234 may include a source/drain main region 234M, which is located on a recess R1, and first to third source/drain protruding regions 234P1, 234P2, and 234P3, which are integrally connected to the source/drain main region 234M and protrude from the source/drain main region 234M toward the first to third nanosheets N21, N22, and N23. The first to third source/drain protruding regions 234P1, 234P2, and 234P3 may be in physical contact with the first to third nanosheets N21, N22, and N23, respectively. One source/drain region 234 may include a pair of first source/drain protruding regions 234P1, a pair of second source/drain protruding regions 234P2, and a pair of third source/drain protruding regions 234P3. The pair of first source/drain protruding regions 234P1 may protrude in opposite directions toward the first nanosheet N21 of each of a pair of nanosheet stacks NSS2 located adjacent to each other on both sides of a source/drain region 234. The pair of second source/drain protruding regions 234P2 may protrude in opposite directions toward the second nanosheet N22 of each of the pair of nanosheet stacks NSS2. The pair of third source/drain protruding regions 234P3 may protrude in opposite directions toward the third nanosheet N23 of each of the pair of nanosheet stacks NSS2. In the first horizontal direction (X direction), lengths LP22 of the second and third source/drain protruding regions 234P2 and 234P3 may be substantially equal or similar and be less than a length LP21 of the first source/drain protruding region 234P1.

Detailed configurations and effects of the plurality of nanosheet stacks NSS2 and the plurality of source/drain regions 234 may be the same as or similar to those of the plurality of nanosheet stacks NSS and the plurality of source/drain regions 134 described with reference to FIGS. 1, 2A, and 2B.

Figure 4:
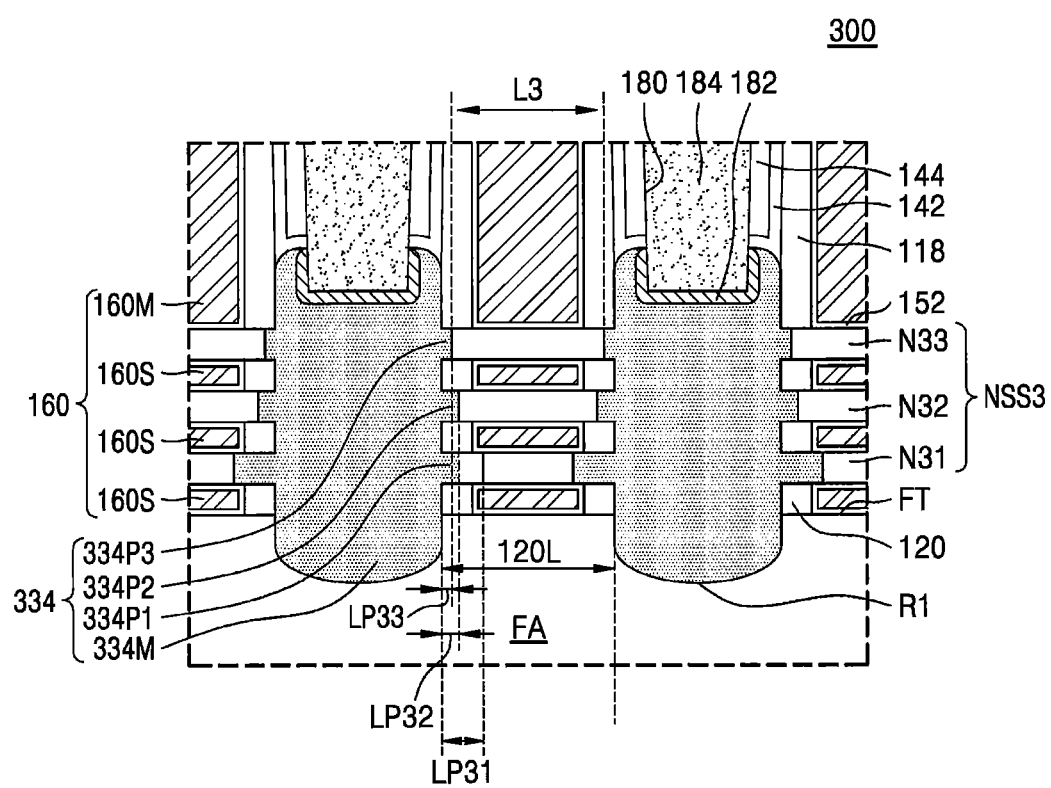
FIG. 4 is a cross-sectional view of an IC device according to some embodiments of the inventive concept, which is an enlarged cross-sectional view of a region corresponding to the partial region denoted by "X1" in FIG. 2A.

FIG. 4 is a cross-sectional view of an IC device 300 according to some embodiments of the inventive concept, which is an enlarged cross-sectional view of a region corresponding to the partial region X1 in FIG. 2A.

Referring to FIG. 4, the IC device 300 may have substantially the same configuration as the IC device 100 described with reference to FIGS. 1, 2A, and 2B. However, the IC device 300 may include a plurality of nanosheet stacks NSS3 facing fin top surfaces FT of a plurality of fin-type active regions FA. The plurality of nanosheet stacks NSS3 may include a first nanosheet N31, a second nanosheet N32, and a third nanosheet N33, which are sequentially stacked on the fin top surface FT of the fin-type active region FA. In a first horizontal direction (X direction), a greatest length L3 of the plurality of nanosheet stacks NSS3 may be less than a distance 120L between both outermost sidewalls of inner insulating spacers 120 located on both sides of each of a plurality of sub-gate portions 160S of a gate line 160.

The first to third nanosheets N31, N32, and N33 may have different lengths in the horizontal direction (X direction). The first nanosheet N31, which is closest to the fin top surface FT from among the first to third nanosheets N31, N32, and N33, may have a shortest length, and lengths of the second and third nanosheets N32 and N33 may increase in a direction away from the fin top surface FT.

The IC device 300 may include a plurality of source/drain regions 334. Each of the plurality of source/drain regions 334 may include a source/drain main region 334M, which is located on a recess R1, and first to third source/drain protruding regions 334P1, 334P2, and 334P3, which are integrally connected to the source/drain main region 334M and protrude from the source/drain main region 334M toward the first to third nanosheets N31, N32, and N33. The first to third source/drain protruding regions 334P1, 334P2, and 334P3 may be in physical contact with the first to third nanosheets N21, N22, and N23, respectively. In the first horizontal direction (X direction), from among the first to third source/drain protruding regions 334P1, 334P2, and 334P3, the first source/drain protruding region 334P1 may have a shortest length, and the second and third source/drain protruding regions 334P2 and 334P3 may have reduced lengths in a direction away from the fin top surface FT.

One source/drain region 334 may include a pair of first source/drain protruding regions 334P1, a pair of second source/drain protruding regions 334P2, and a pair of third source/drain protruding regions 334P3. The pair of first source/drain protruding regions 334P1 may protrude in opposite directions toward the first nanosheet N31 of each of a pair of nanosheet stacks NSS3 adjacent to each other on both sides of a source/drain region 334. The pair of second source/drain protruding regions 334P2 may protrude in opposite directions toward the second nanosheet N32 of each of the pair of nanosheet stacks NSS3. The pair of third source/drain protruding regions 334P3 may protrude in opposite directions toward the third nanosheet N33 of each of the pair of nanosheet stacks NSS3. In the first horizontal direction (X direction), lengths LP31, LP32, and LP33 of the first to third source/drain protruding regions 334P1, 334P2, and 334P3 may be reduced in a direction away from the fin top surface FT, and the length LP31 of the first source/drain protruding region 334P1 may be the longest.

Although FIG. 4 illustrates an example in which the length of the second nanosheet N32 is less than the length of the third nanosheet N33 in the first horizontal direction (X direction), the inventive concept is not limited thereto. For example, the length of the third nanosheet N33 may be less than the length of the second nanosheet N32. In this case, the length LP32 of the second source/drain protruding region 334P2 may be less than the length LP33 of the third source/drain protruding region 334P3.

Detailed configurations and effects of the plurality of nanosheet stacks NSS3 and the plurality of source/drain regions 334 may be the same as or similar to those of the plurality of nanosheet stacks NSS and the plurality of source/drain regions 134 described with reference to FIGS. 1, 2A, and 2B.

Figure 5A:
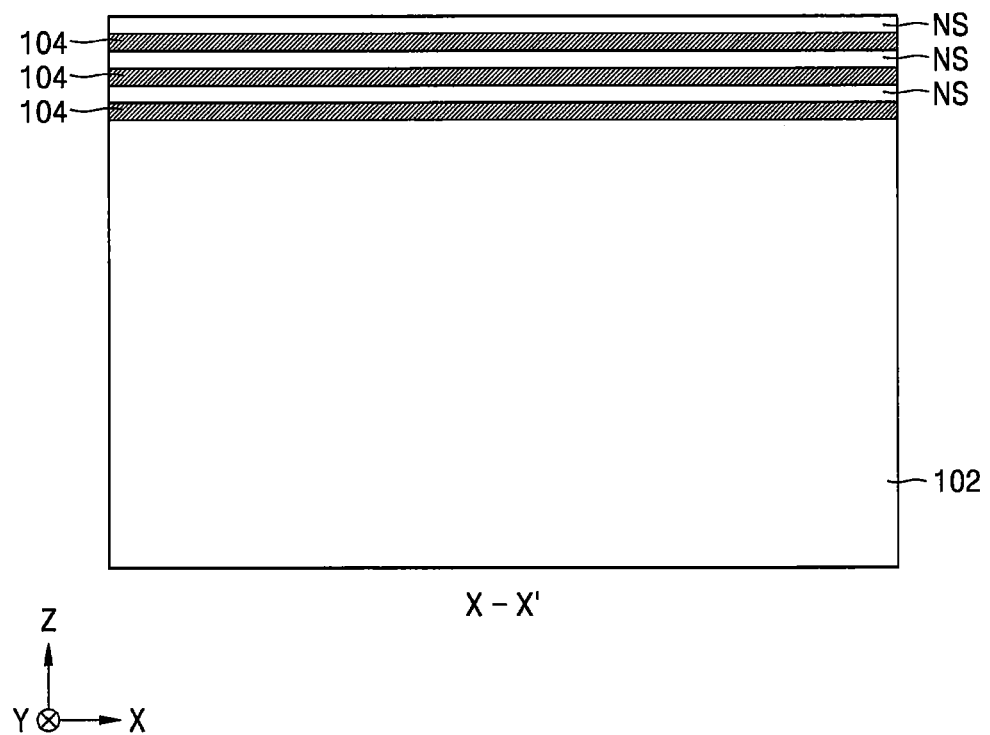
FIGS. 5A to 5Q are cross-sectional views illustrating a process sequence of a method of manufacturing an IC device according to some embodiments of the inventive concept.
Figure 5B:
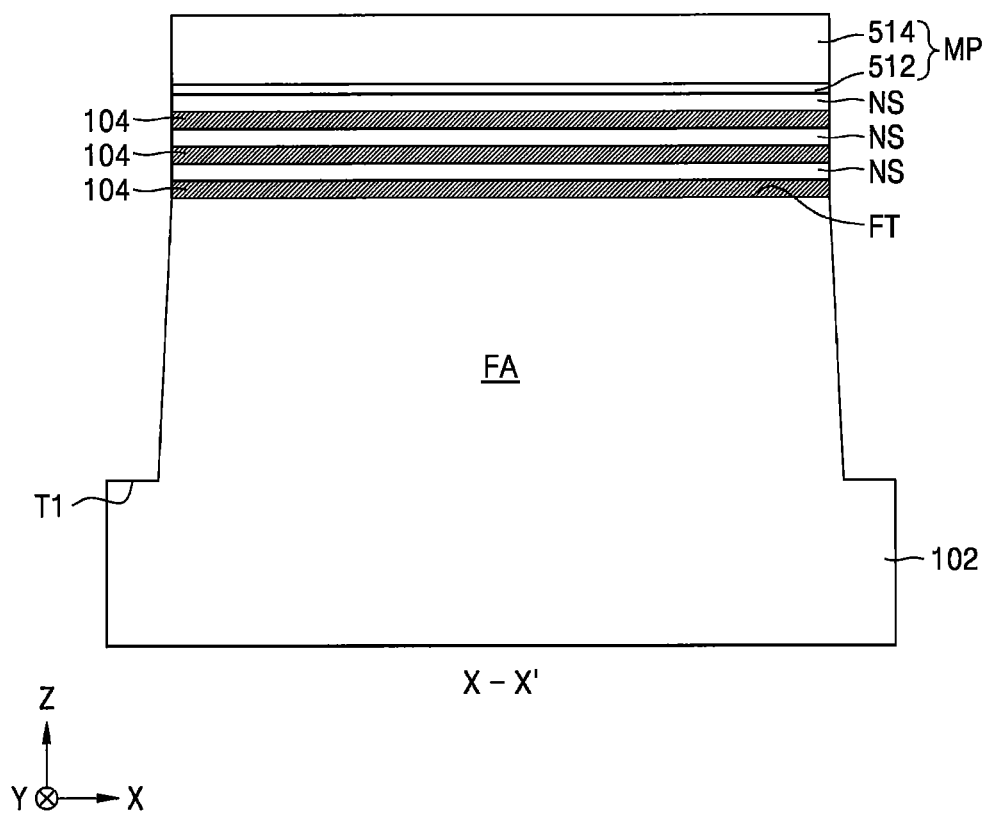
Figure 5C:
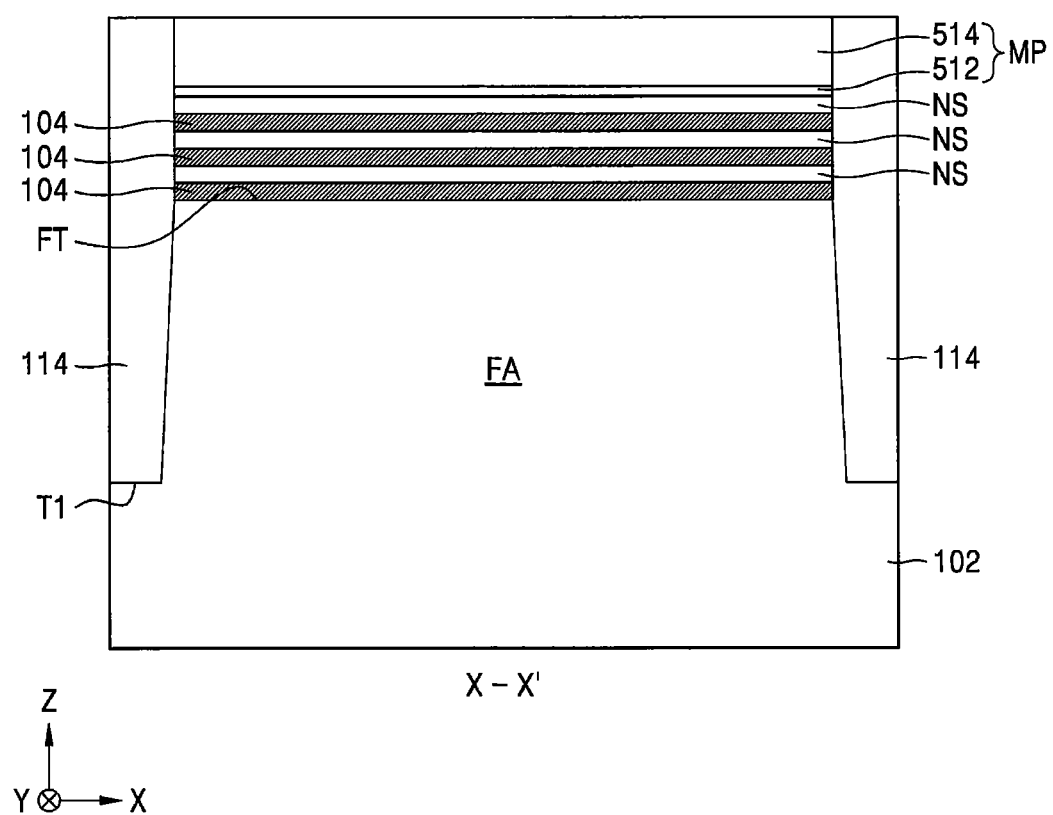
Figure 5D:
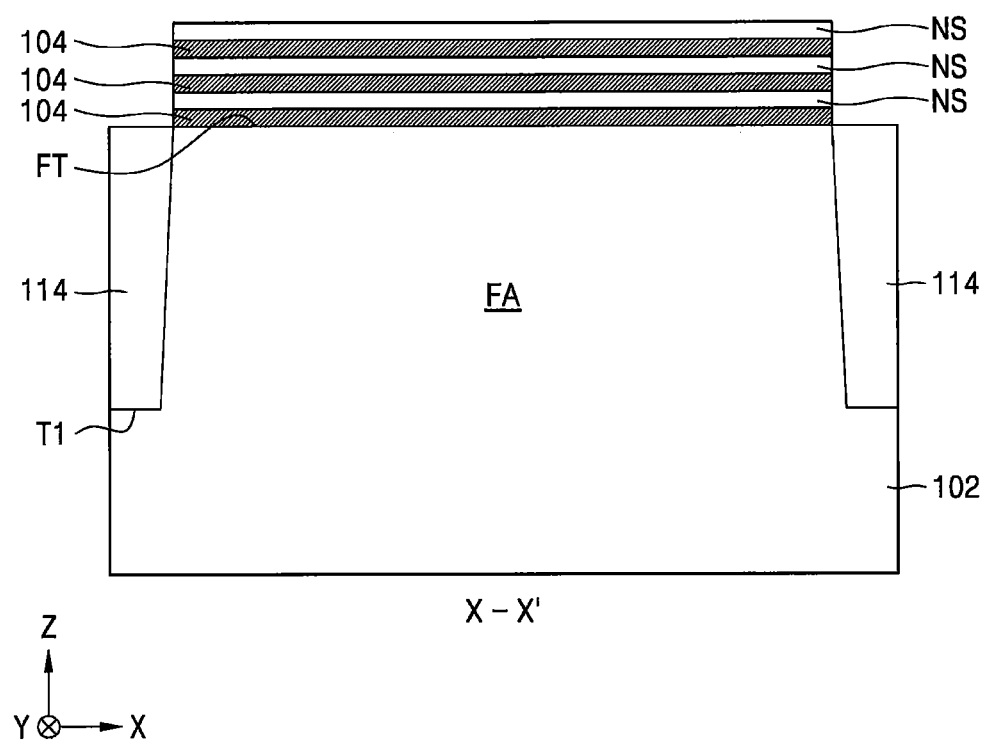
Figure 5E:
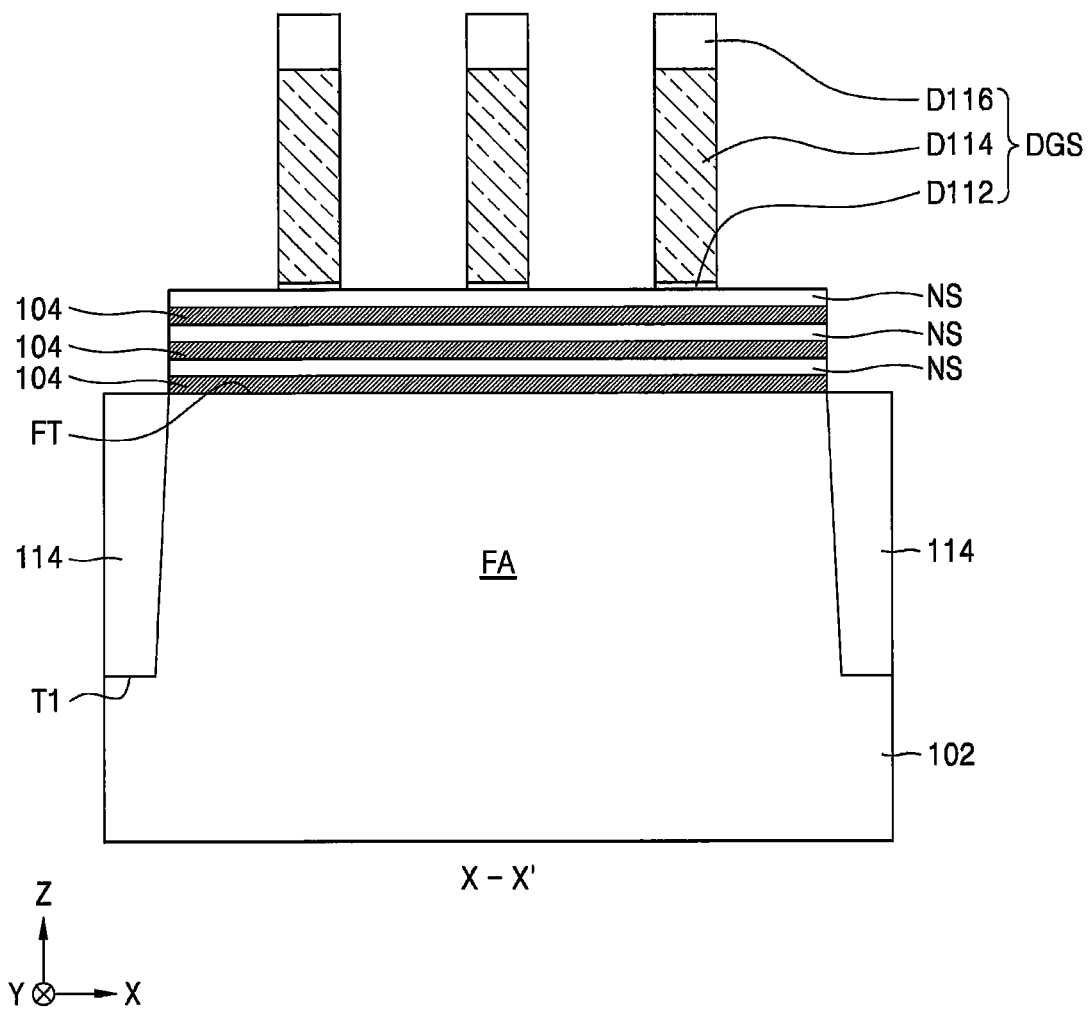
Figure 5F:
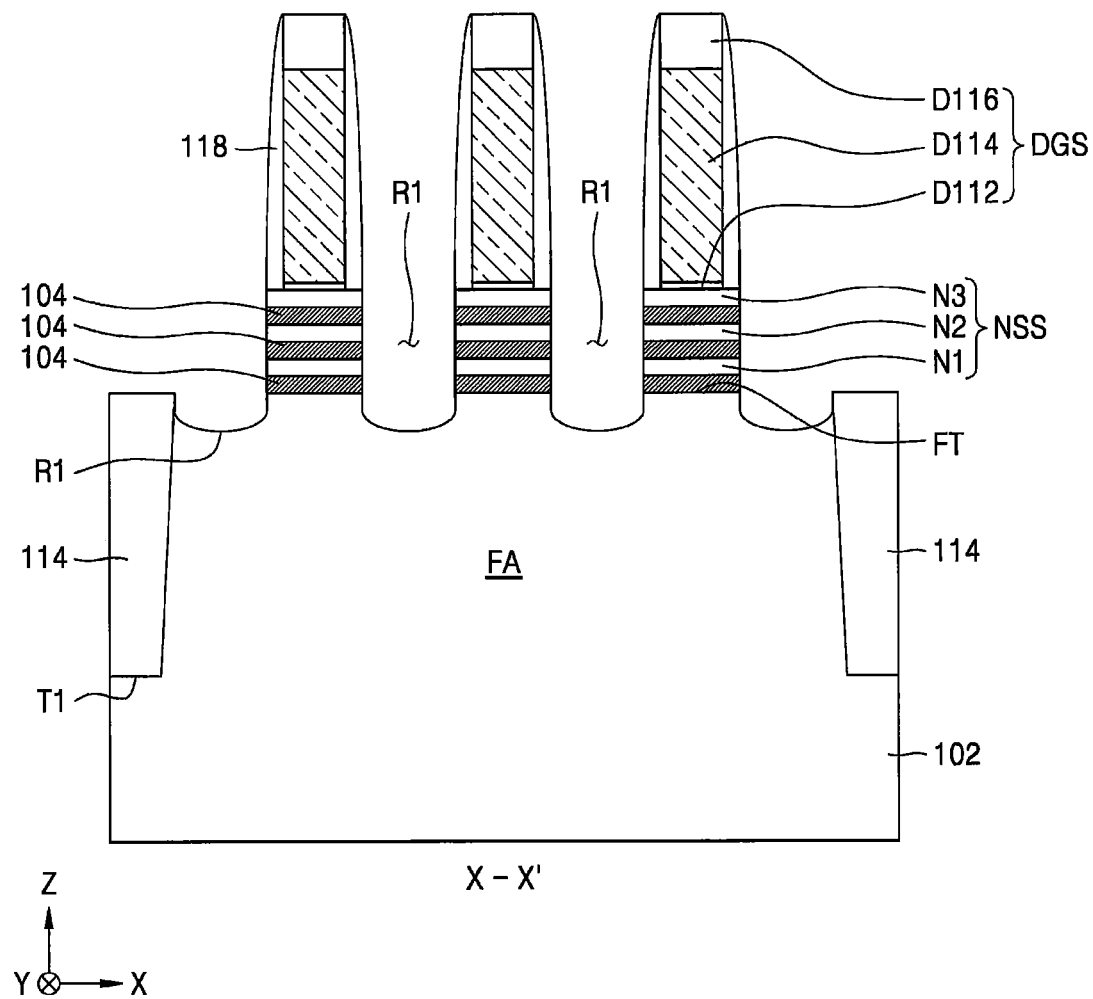
Figure 5G:
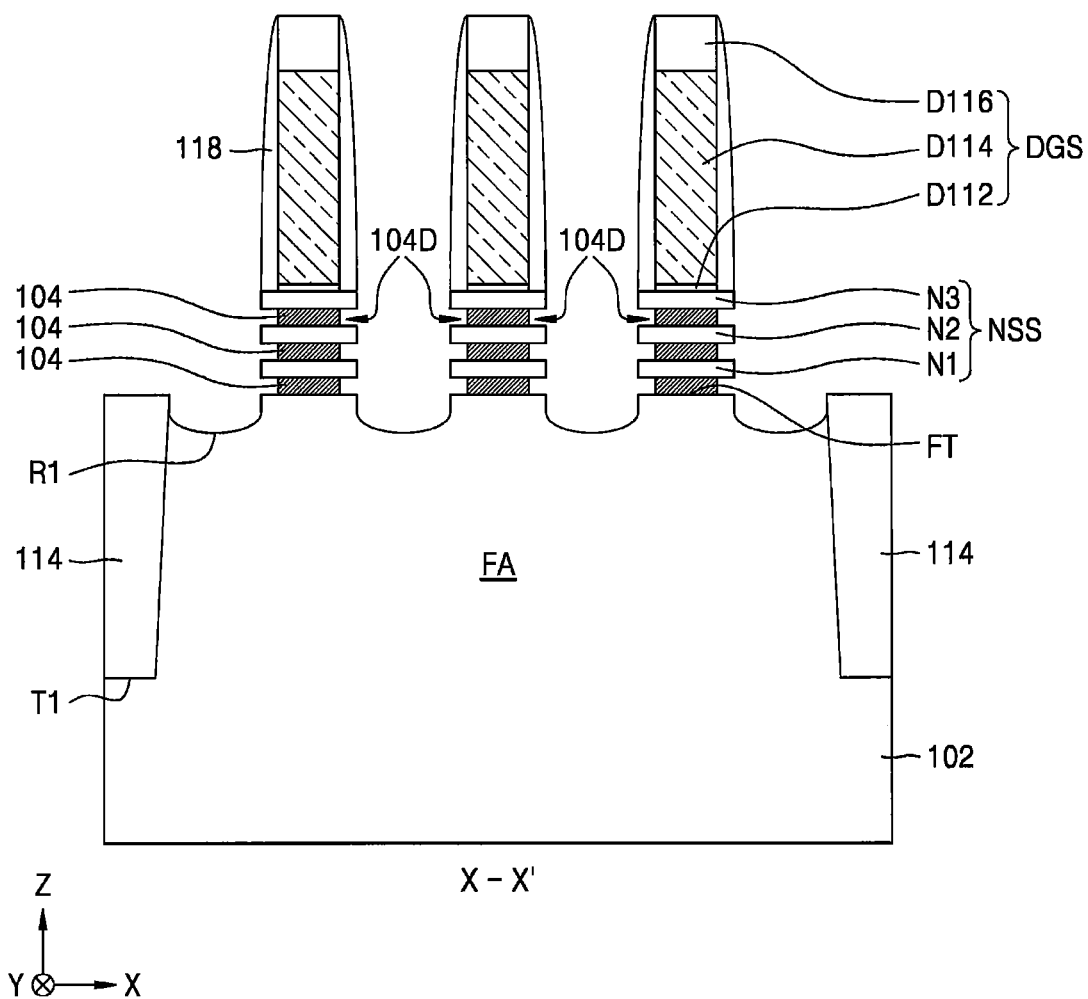
Figure 5H:
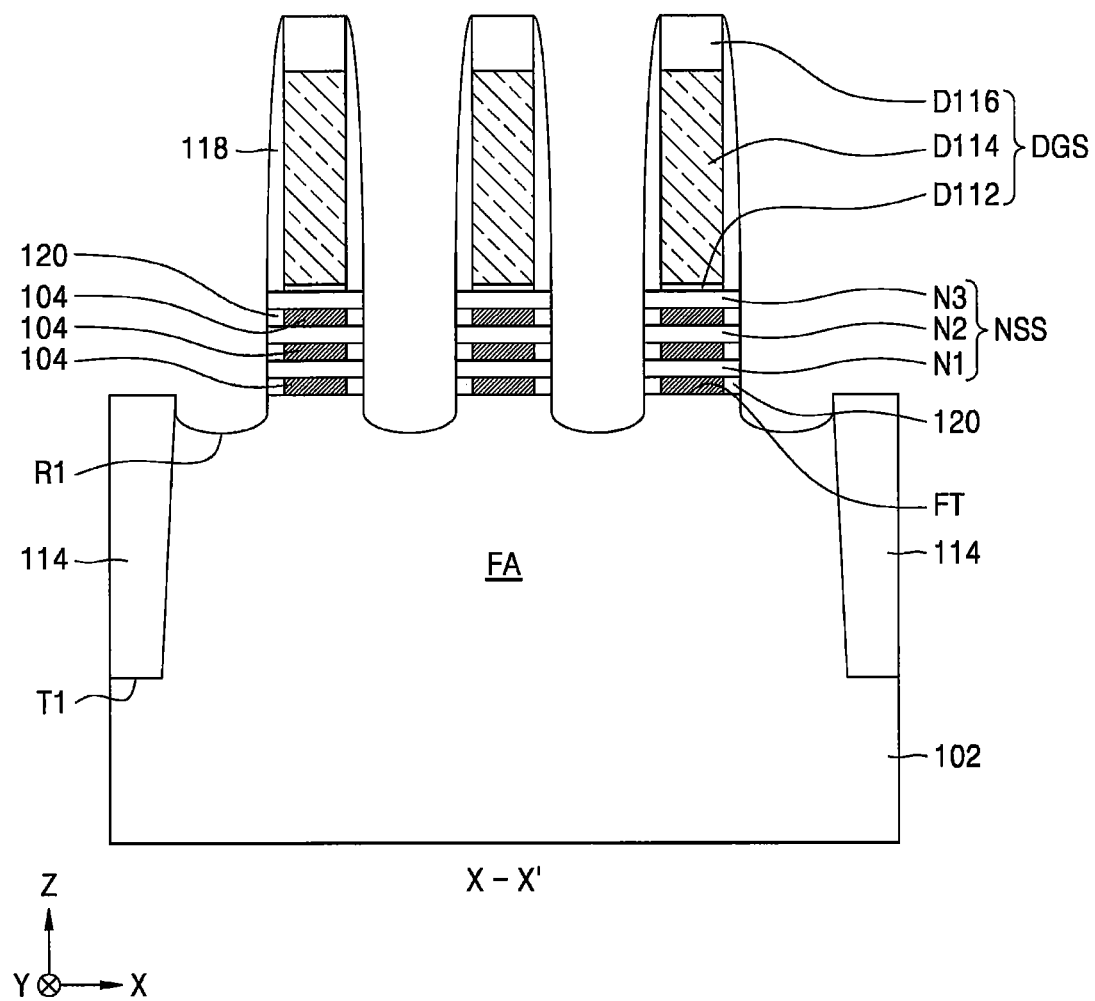
Figure 5I:
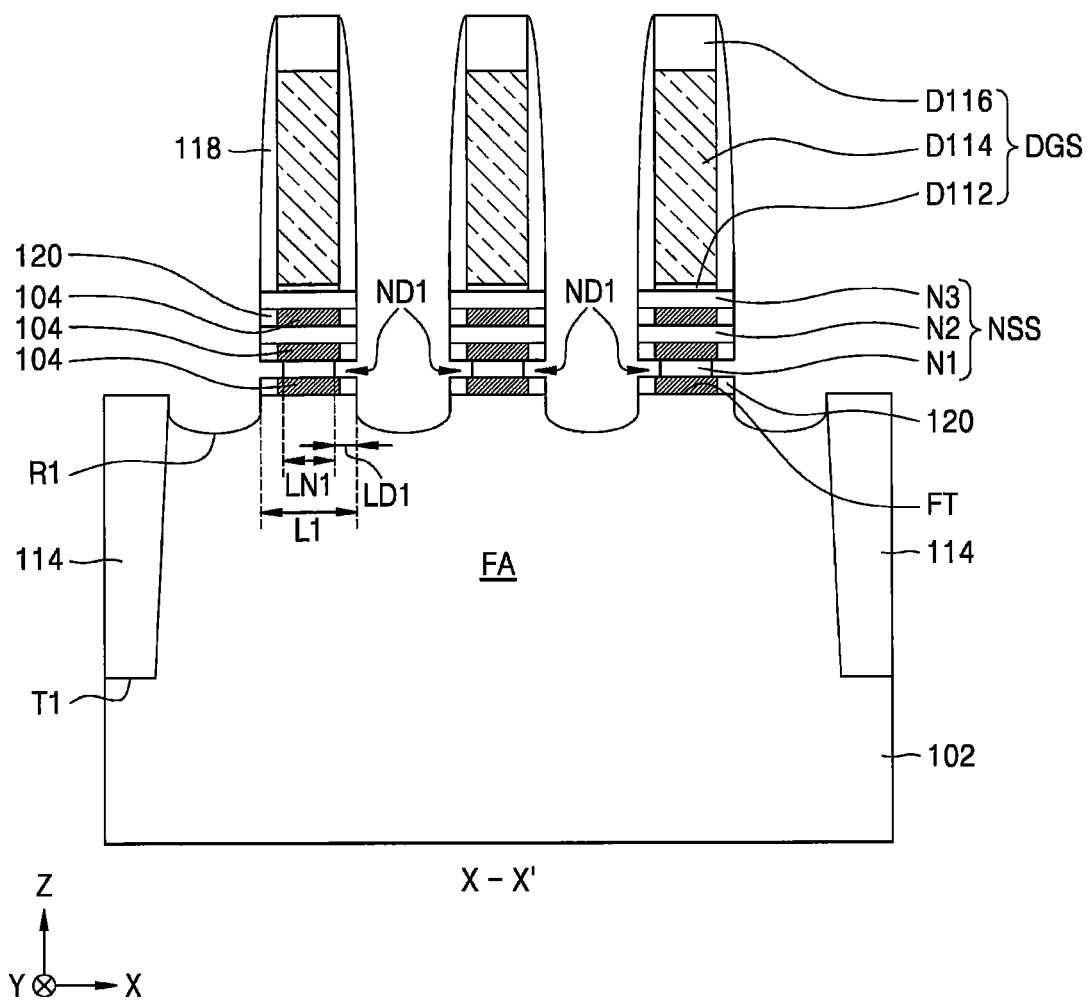
Figure 5J:
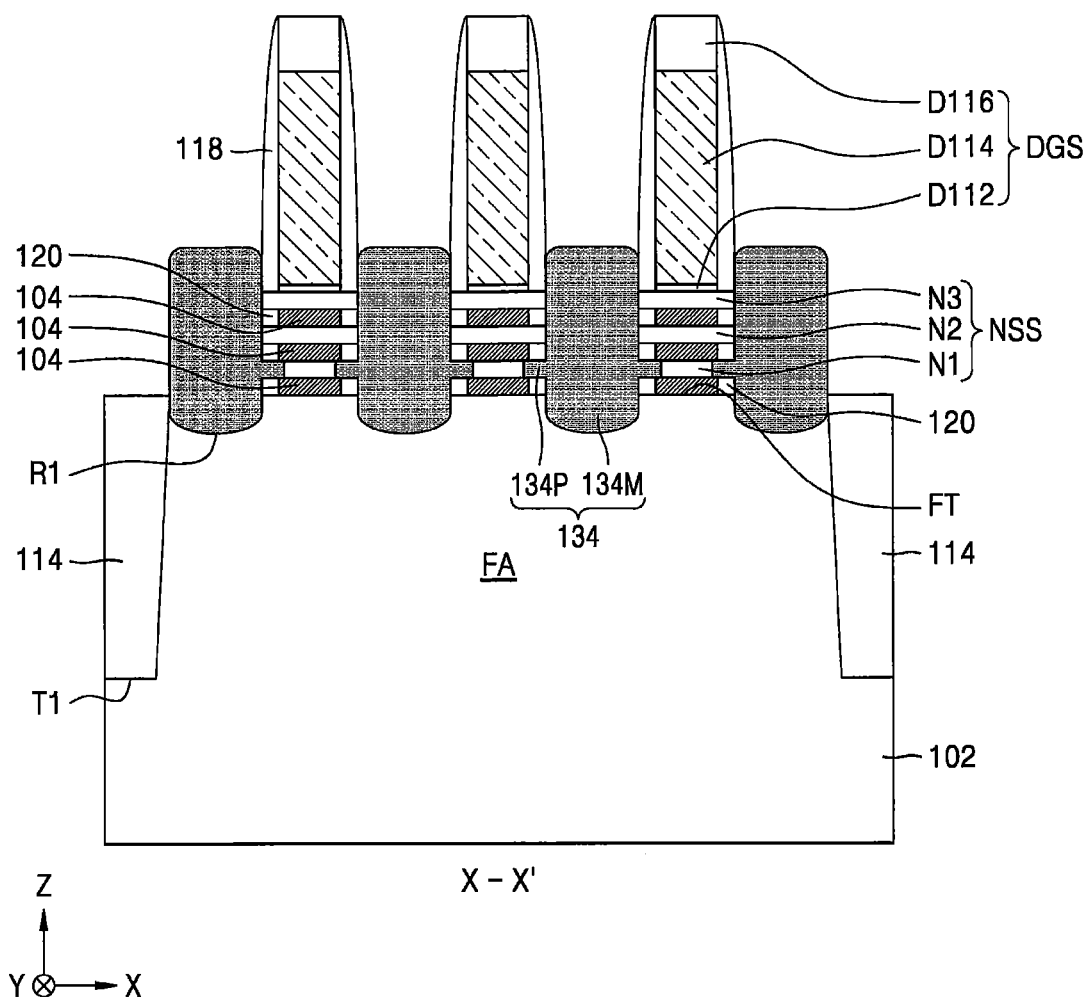
Figure 5K:
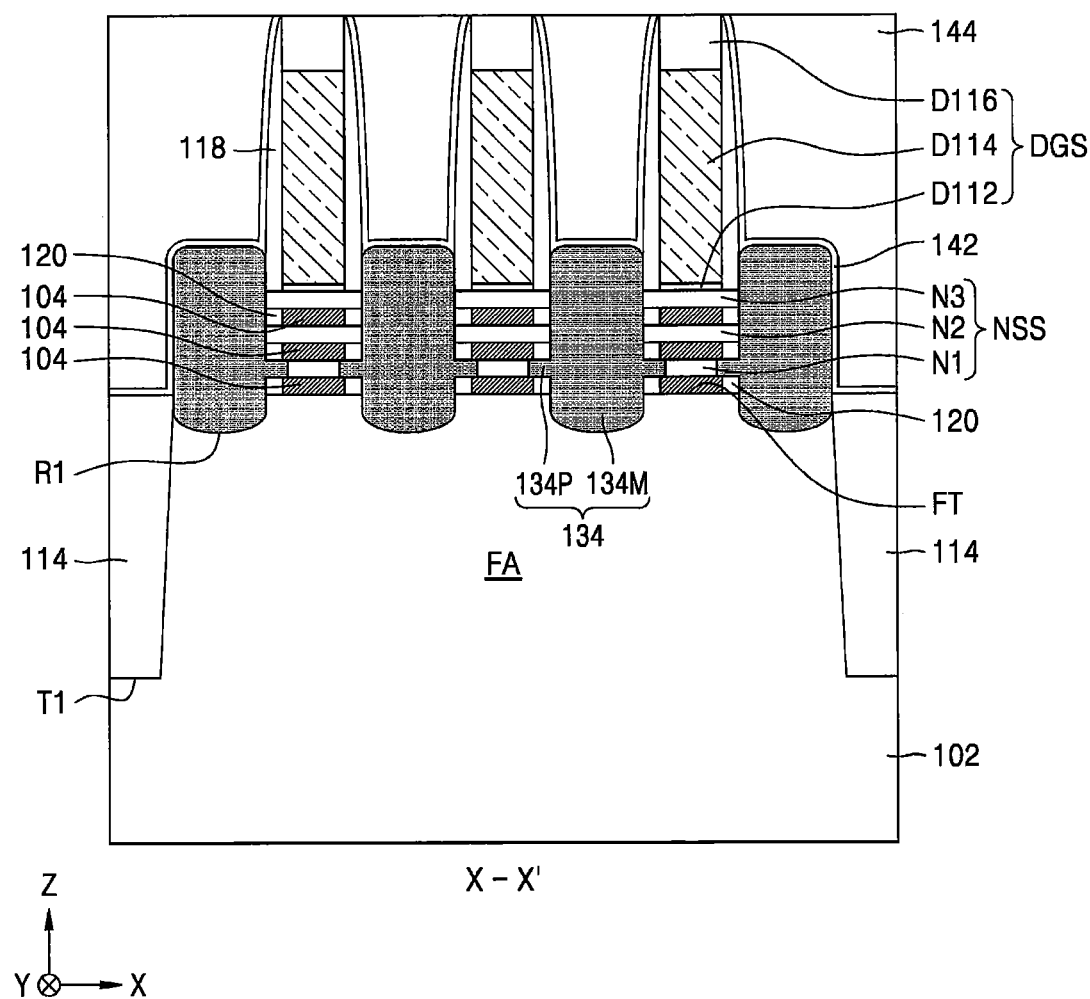
Figure 5L:
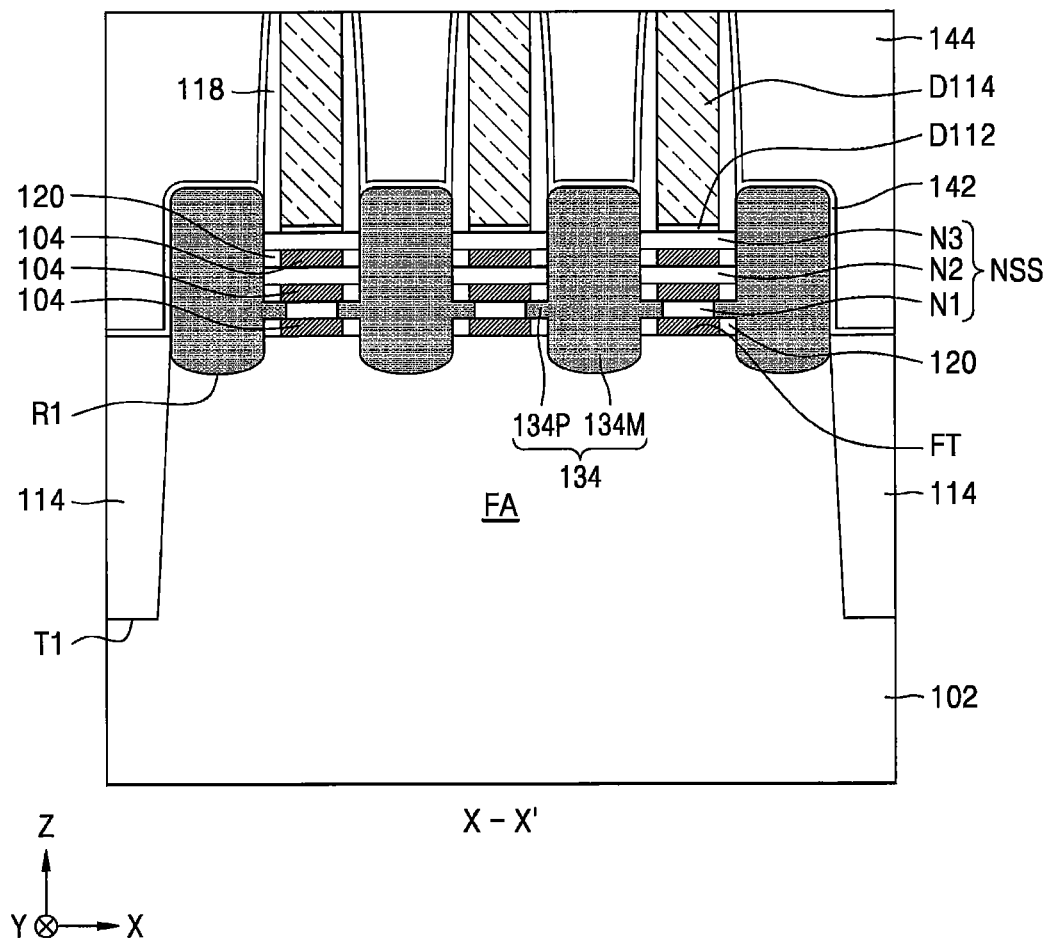
Figure 5M:
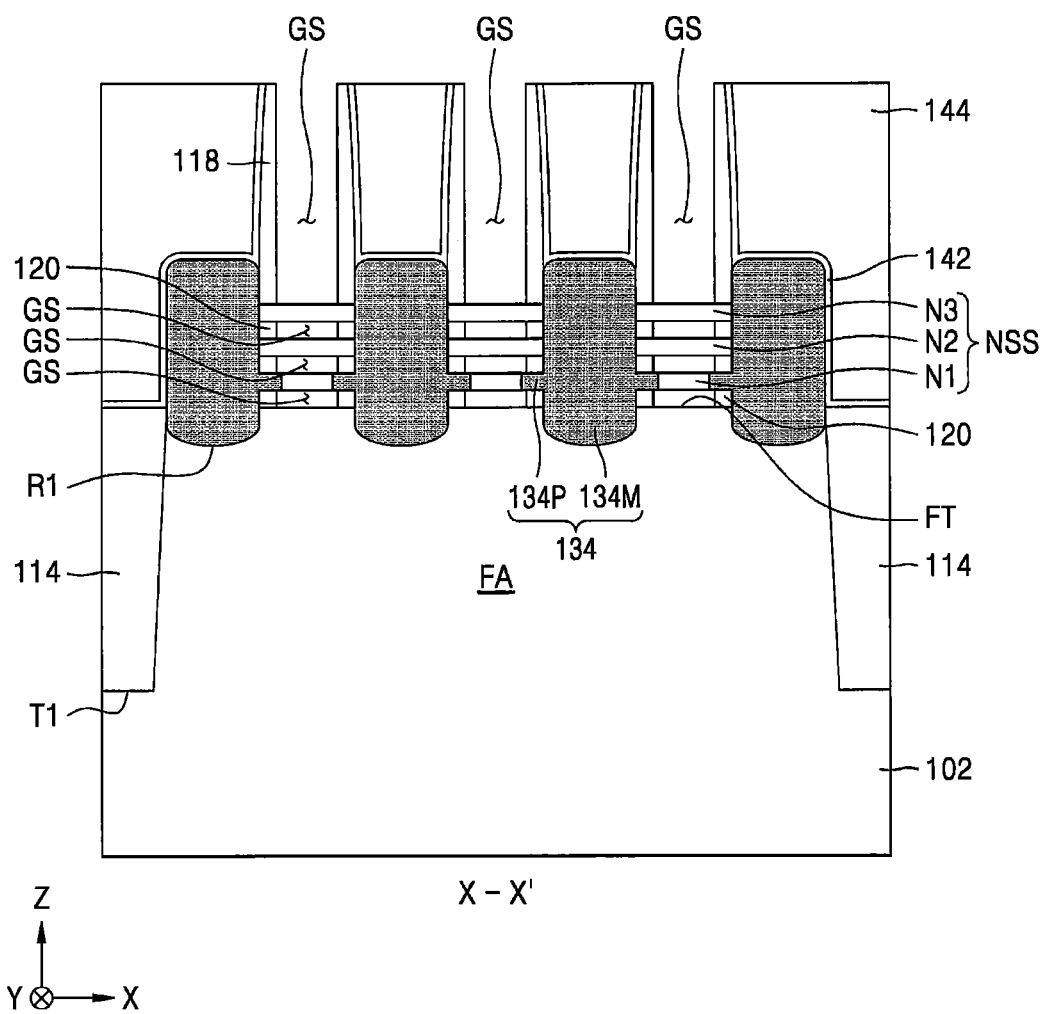
Figure 5N:
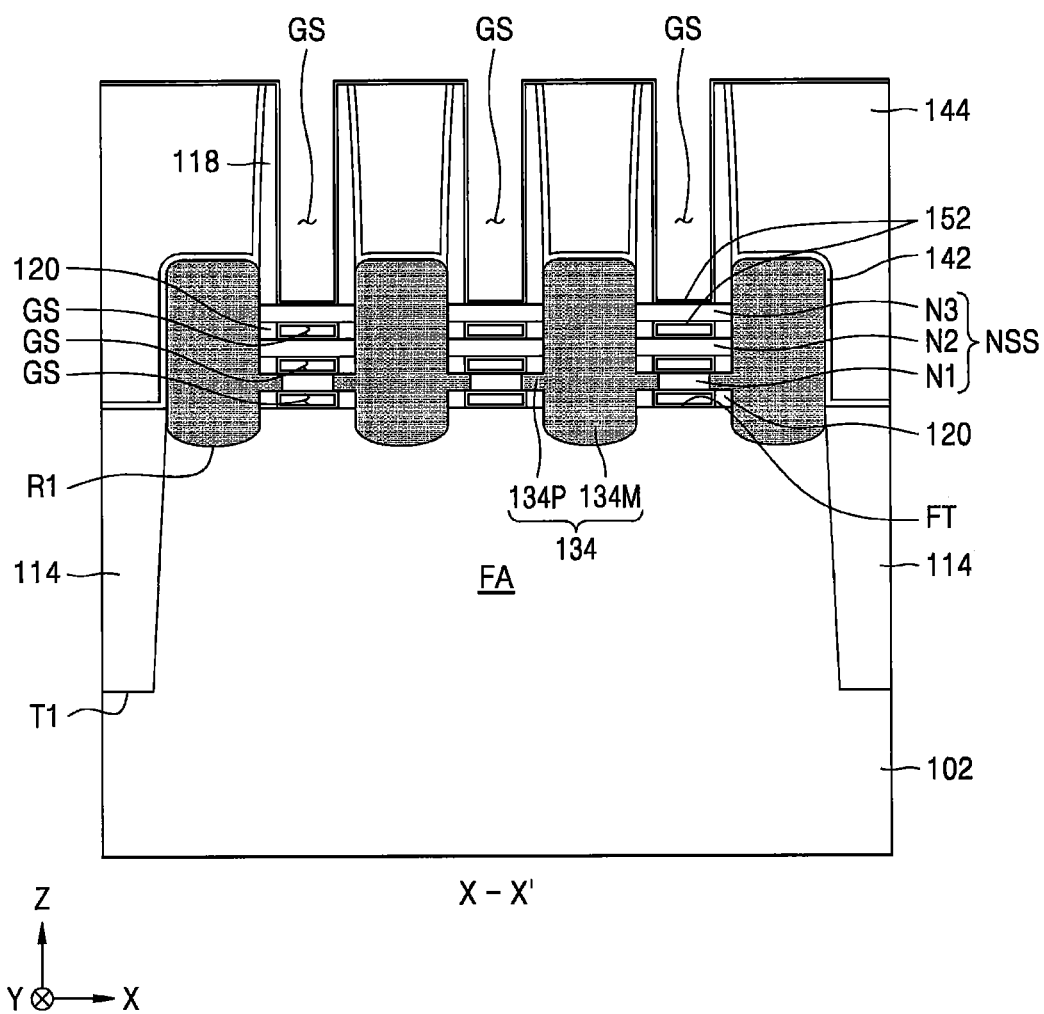
Figure 50:
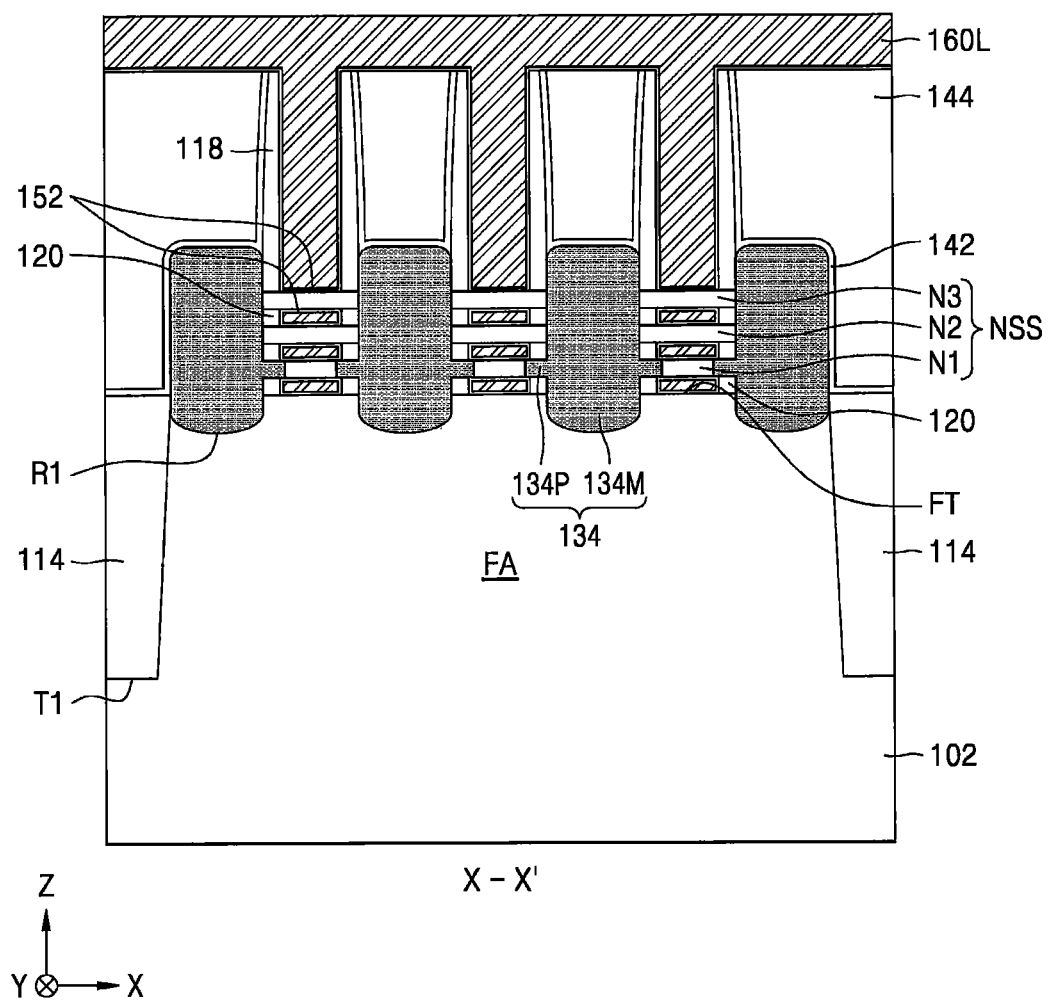
Figure 5P:
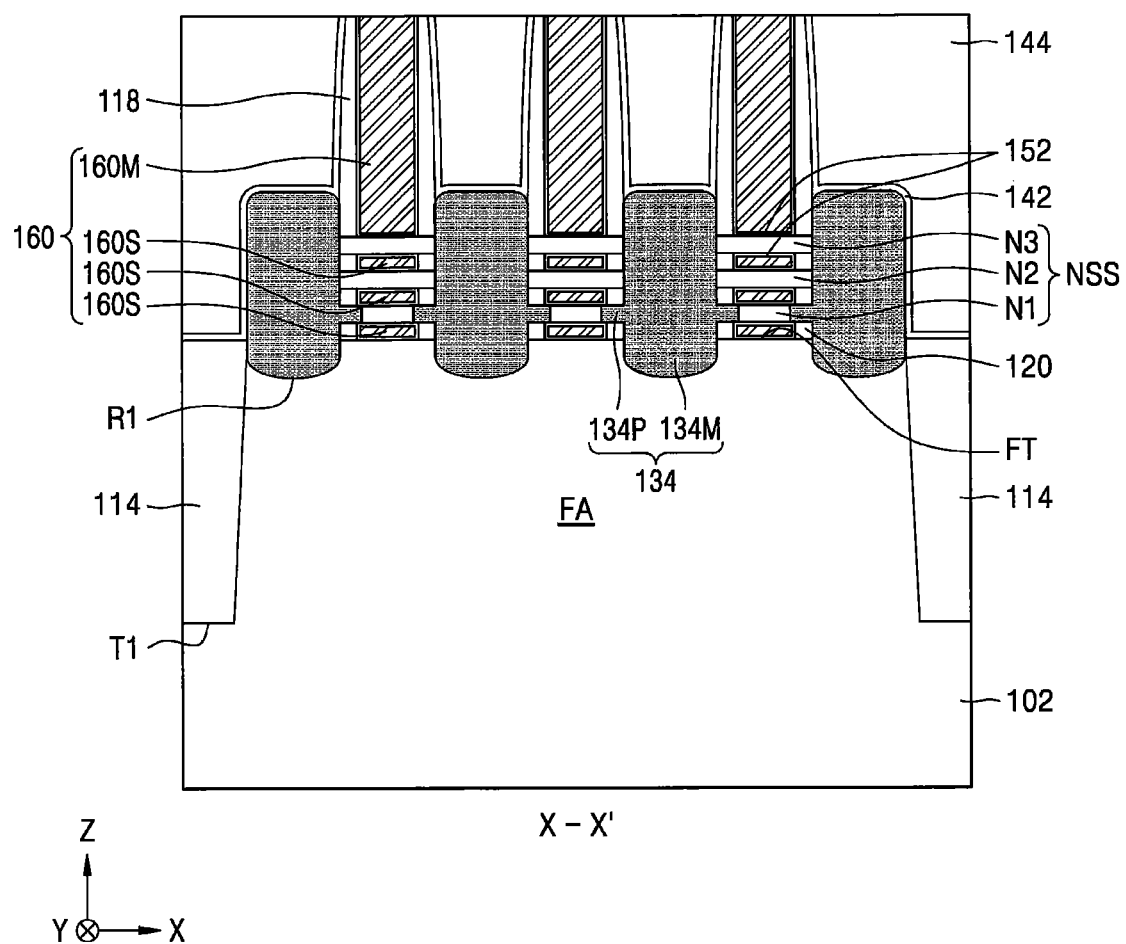
Figure 5Q:
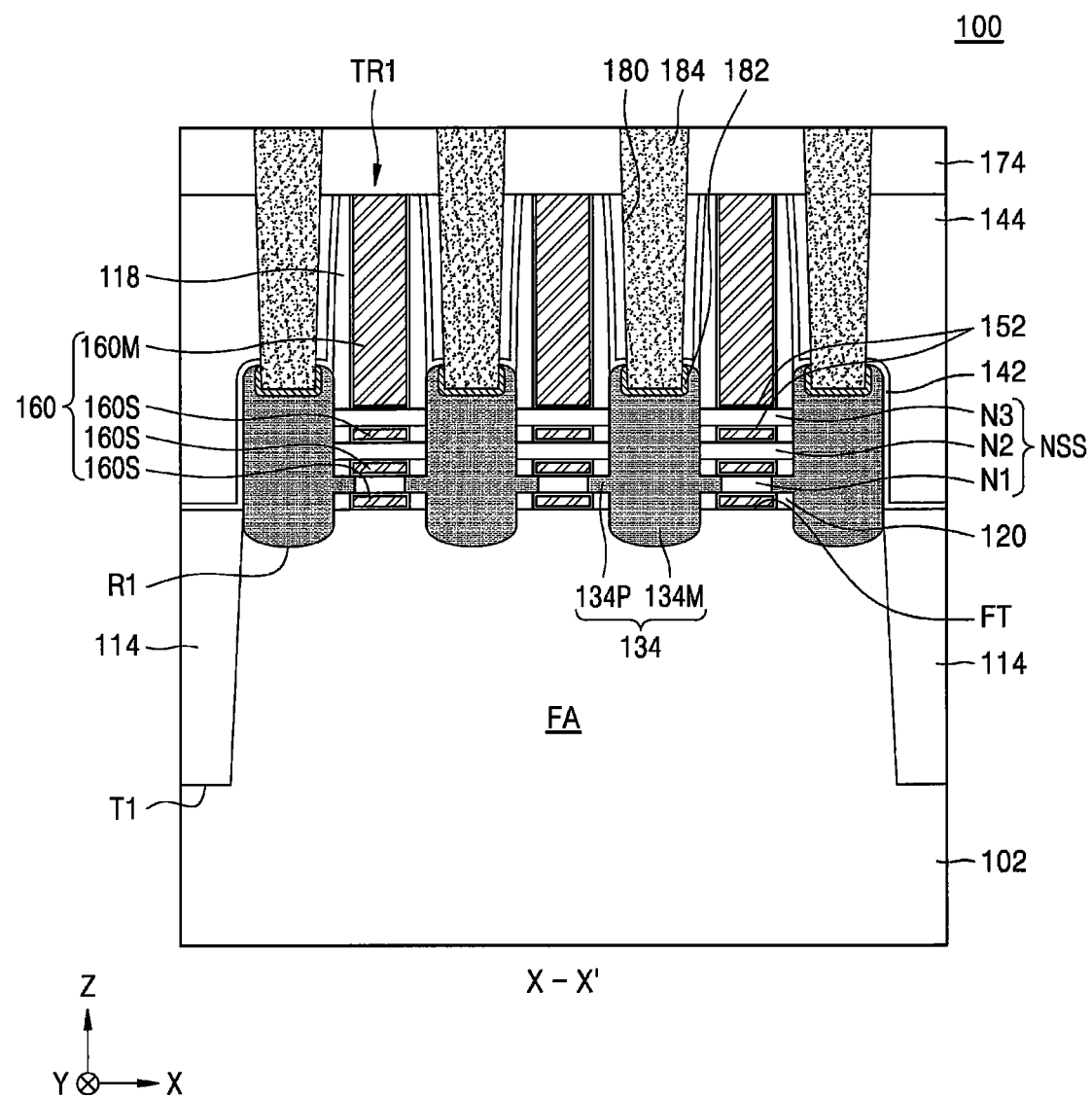

FIGS. 5A to 5Q are cross-sectional views illustrating a process sequence of a method of manufacturing an IC device 100 according to some embodiments of the inventive concept. A method of manufacturing the IC device 100 described with reference to FIGS. 1, 2A, and 2B, according to an example embodiment, will be described with reference to FIGS. 5A to 5Q. FIGS. 5A to 5Q illustrate cross-sectional configurations of a portion corresponding to a cross-section taken along the line X-X' of FIG. 1, according to the process sequence. In FIGS. 5A to 5Q, the same reference numerals are used to denote the same elements as in FIGS. 1, 2A, and 2B, and detailed descriptions thereof will be omitted.

Referring to FIG. 5A, a plurality of sacrificial semiconductor layers 104 and a plurality of nanosheet semiconductor layers NS may be alternately stacked on a substrate 102.

The plurality of sacrificial semiconductor layers 104 and the plurality of nanosheet semiconductor layers NS may include semiconductor materials having different etch selectivities. In some embodiments, the plurality of nanosheet semiconductor layers NS may include silicon (Si), and the plurality of sacrificial semiconductor layers 104 may include silicon germanium (SiGe). In some other embodiments, the plurality of nanosheet semiconductor layers NS may include silicon germanium, and the plurality of sacrificial semiconductor layers 104 may include silicon or germanium. In some other embodiments, the plurality of nanosheet semiconductor layers NS may include indium gallium arsenide (InGaAs) or indium gallium antimonide (InGaSb), and the plurality of sacrificial semiconductor layers 104 may include indium phosphide (InP).

Referring to FIG. 5B, a mask pattern MP may be formed on a stack structure of the plurality of sacrificial semiconductor layers 104 and the plurality of nanosheet semiconductor layers NS. The plurality of sacrificial semiconductor layers 104, the plurality of nanosheet semiconductor layers NS, and the substrate 102 may be partially etched using the mask pattern MP as an etch mask to form a trench T1. As a result, a fin-type active region FA may be defined by the trench T1, the stack structure of the plurality of sacrificial semiconductor layers 104 and the plurality of nanosheet semiconductor layer NS may remain on a fin top surface FT of the fin-type active region FA.

The mask pattern MP and the fin-type active region FA may include line patterns extending lengthwise in an X direction. The mask pattern MP may include a pad oxide film pattern 512 and a hard mask pattern 514. The hard mask pattern 514 may include silicon nitride, polysilicon, a spin-on hardmask (SOH) material, or a combination thereof. The SOH material may include a hydrocarbon compound at a relatively high carbon content of about 85% to 99% by weight, based on the total weight of the SOH material.

Referring to FIG. 5C, a device isolation film 114 may be formed inside the trench T1.

Referring to FIG. 5D, the mask pattern MP may be removed from the resultant structure of FIG. 5C and the device isolation film 114 may be partially removed so that a top surface of the device isolation film 114 may be at substantially the same level as or a similar level to the fin top surface FT of the fin-type active region FA.

Referring to FIG. 5E, a plurality of dummy gate structures DGS may be formed on the stack structure of the plurality of sacrificial semiconductor layers 104 and the plurality of nanosheet semiconductor layers NS, which remain on the fin-type active region FA.

Each of the plurality of dummy gate structures DGS may extend in a direction that intersects with the fin-type active region FA. Each of the plurality of dummy gate structures DGS may have a structure in which an oxide film D112, a dummy gate layer D114, and a capping layer D116 are sequentially stacked. In some embodiments, the dummy gate layer D114 may include polysilicon, and the capping layer D116 may include a silicon nitride film.

Referring to FIG. 5F, a plurality of outer insulating spacers 118 may be respectively formed to cover both sidewalls of the plurality of dummy gate structures DGS. Thereafter, the plurality of sacrificial semiconductor layers 104 and the plurality of nanosheet semiconductor layers NS may be partially removed using the plurality of dummy gate structures DGS and the plurality of outer insulating spacers 118 as etch masks so that the plurality of nanosheet semiconductor layers NS may be divided into a plurality of nanosheet stacks NSS including a plurality of nanosheets (e.g., first to third nanosheets N1, N2, and N3). Afterwards, the fin-type active region FA, which is exposed between the respective nanosheet stacks NSS, may be etched to form recesses R1 in an upper portion of the fin-type active region FA. To form a plurality of recesses R1, the fin-type active region FA may be etched using a dry etching process, a wet etching process, or a combination thereof.

Referring to FIG. 5G, the plurality of sacrificial semiconductor layers 104, which are exposed on both sides of the plurality of nanosheet stacks NSS through the plurality of recesses R1, may be partially removed to form a plurality of sacrificial indent regions 104D among the first to third nanosheets N1, N2, and N3 and between the first nanosheet N1 and the fin top surface FT of the fin-type active region FA.

To form the plurality of sacrificial indent regions 104D, portions of the plurality of sacrificial semiconductor layers 104 may be selectively etched using an etch selectivity between the plurality of sacrificial semiconductor layers 104 and the first to third nanosheets N1, N2, and N3.

Referring to FIG. 5H, a plurality of inner insulating spacers 120 may be formed to at least partially fill the plurality of sacrificial indent regions 104D (refer to FIG. 5G). To form the plurality of inner insulating spacers 120, an atomic layer deposition (ALD) process, a chemical vapor deposition (CVD) process, an oxidation process, or a combination thereof may be used.

Referring to FIG. 5I, from among the first to third nanosheets N1, N2, and N3, which are exposed on both sides of each of the plurality of nanosheet stacks NSS through the plurality of recesses R1, the first nanosheet N1 closest to the fin top surface FT may be partially removed, so that a length of the first nanosheet N1 may be reduced, and first nanosheet indent regions ND1 may be formed on both sides of the first nanosheet N1 and communicate with the recesses R1.

After the first nanosheet indent regions ND1 are formed, a length LN1 of the first nanosheet N1 may be less than a greatest length L1 of the nanosheet stack NSS in a first horizontal direction (X direction).

In some embodiments, the first nanosheet indent regions ND1 may be formed using an isotropic etching process. To form the first nanosheet indent regions ND1, only the doped first nanosheet N1 of the first to third nanosheets N1, N2, and N3 may be selectively etched using an etching atmosphere having an etch selectivity based on materials included in the first to third nanosheets N1, N2, and N3, and/or using an etching atmosphere having an etch selectivity based on whether the first to third nanosheets N1, N2, and N3 are doped.

In an example, when the first nanosheet N1 includes a doped Si layer and the second and third nanosheets N2 and N3 include an undoped Si layer, the first nanosheet indent region ND1 may be formed by selectively etching only the doped first nanosheet N1, from among the first to third nanosheets N1, N2, and N3, through vacant spaces on the plurality of recesses R1 in a first etching atmosphere using a difference in etch rate based on whether the Si layer is doped. The first etching atmosphere may include a liquid or gaseous etchant. For example, the first etching atmosphere may include a mixture of HF and $HNO_3$, a mixture of HF, $HNO_3$, and acetic acid ($CH_3COOH$), an aqueous solution containing HF and isopropyl alcohol, an aqueous solution containing HF and HCl, a KOH aqueous solution, tetramethyl ammonium hydroxide (TMAH), and/or ethylene diamine pyrochatechol (EDP), but embodiments of the inventive concept are not limited thereto.

In another example, when the first nanosheet N1 includes a SiGe layer and the second and third nanosheets N2 and N3 include a Si layer, the first nanosheet indent regions ND1 may be formed by selectively etching only the doped first nanosheet N1, from among the first to third nanosheets N1, N2, and N3, through vacant spaces on the plurality of recesses R1 in a second etching atmosphere using a difference in etch rate between SiGe and Si. The second etching atmosphere may include a liquid or gaseous etchant. For example, the second etching atmosphere may include a $CH_3COOH$-based etchant, for example, a mixture of $HNO_3$, HF, and $CH_3COOH$, but the inventive concept is not limited thereto.

Referring to FIG. 5J, a plurality of source/drain regions 134 may be formed on the fin-type active region FA on both sides of the plurality of nanosheet stacks NSS. Each of the plurality of source/drain regions 134 may include a source/drain main region 134M, which is located on the recess R1, and a source/drain protruding region 134P, which is integrally connected to the source/drain main region 134M and protrudes from the source/drain main region 134M toward the first nanosheet N1 to at least partially fill the first nanosheet indent region ND1.

To form the plurality of source/drain regions 134, a semiconductor material may be epitaxially grown from surfaces of the recesses R1 and both sidewalls of the first nanosheet N1, which are exposed through the first nanosheet indent regions ND1.

In some embodiments, to form the plurality of source/drain regions 134, a low-pressure chemical vapor deposition (LPCVD) process, a selective epitaxial growth (SEG) process, or a cyclic deposition and etching (CDE) process may be performed using a precursor including a semiconductor element precursor. The semiconductor element precursor may include an element, such as silicon (Si), germanium (Ge), indium (In), gallium (Ga), arsenic (As), and antimony (Sb).

In an example, the plurality of source/drain regions 134 including silicon may be formed by using a Si-containing compound (e.g., silane ($SiH_4$), disilane ($Si_2H_6$), trisilane ($Si_3H_8$), and dichlorosilane ($SiH_2Cl_2$)) as a silicon source. In another example, the plurality of source/drain regions 134 including SiGe may be formed by further using a gas mixture of a Ge-containing gas (e.g., germane ($GeH_4$)) and $H_2$ in addition to the silicon source. A dopant ion implantation process may be performed in-situ with the epitaxial growth process for forming the plurality of source/drain regions 134.

In some embodiments, when the first to third nanosheets N1, N2, and N3 include Si, Ge, and/or SiGe, the plurality of source/drain regions 134 may include a Si layer, a SiGe layer, and/or a SiC layer. In some other embodiments, when the first to third nanosheets N1, N2, and N3 include InGaAs, the plurality of source/drain regions 134 may include InGaAs and/or InAs. When the first to third nanosheets N1, N2, and N3 include InGaSb, the plurality of source/drain regions 134 may include InGaSb.

In some embodiments, each of the plurality of source/drain regions 134 may be formed to include a plurality of semiconductor layers having different dopant concentrations. For example, each of the plurality of source/drain regions 134 may be formed to have a dopant concentration decreasing in a direction toward the fin-type active region FA and the first to third nanosheets N1, N2, and N3 and have a dopant concentration increasing in a direction away from the fin-type active region FA and the first to third nanosheets N1, N2, and N3. In some embodiments, the dopant concentration may monotonically decrease in the direction toward the fin-type active region FA and may monotonically increase in the direction away from the fin-type active region FA.

Referring to FIG. 5K, a protective insulating film 142 may be formed to at least partially cover the resultant structure having the plurality of source/drain regions 134. An inter-gate dielectric film 144 may be formed on the protective insulating film 142, and the protective insulating film 142 and the inter-gate dielectric film 144 may be planarized to expose a top surface of the capping layer D116.

Referring to FIG. 5L, the capping layer D116 may be removed from the resultant structure of FIG. 5K to expose the dummy gate layer D114. Thereafter, the protective insulating film 142 and the inter-gate dielectric film 144 may be partially removed so that a top surface of the inter-gate dielectric film 144 may be at substantially the same level as a top surface of the dummy gate layer D114.

Referring to FIG. 5M, the dummy gate layer D114 and the oxide film D112 located thereunder may be removed from the resultant structure of FIG. 5L to prepare gate spaces GS, and the plurality of nanosheet stacks NSS may be exposed through the gate spaces GS. Thereafter, the plurality of sacrificial semiconductor layers 104 remaining on the fin-type active region FA may be removed through the gate spaces GS so that the gate spaces GS may be extended to spaces between the first to third nanosheets N1, N2, and N3 and a space between the first nanosheet N1 and the fin top surface FT.

Referring to FIG. 5N, a gate dielectric film 152 may be formed to at least partially cover exposed surfaces of the first to third nanosheets N1, N2, and N3 and the fin-type active region FA. The gate dielectric film 152 may be formed using an ALD process.

Referring to FIG. 5O, a gate-forming conductive layer 160L may be formed on the gate dielectric film 152 to at least partially fill the gate spaces GS (refer to FIG. 5N) and cover the top surface of the inter-gate dielectric film 144. The gate-forming conductive layer 160L may include a metal, a metal nitride, a metal carbide, or a combination thereof. The gate-forming conductive layer 160L may be formed using an ALD process.

Referring to FIG. 5P, the gate-forming conductive layer 160L and the gate dielectric film 152 may be at least partially removed from the top surface of the inter-gate dielectric film 144 to expose the top surface of the inter-gate dielectric film 144 in the resultant structure of FIG. 5O. As a result, a plurality of gate lines 160 may be formed to fill a plurality of gate spaces GS. Each of the plurality of gate lines 160 may include a main gate portion 160M and a plurality of sub-gate portions 160S. A planarization process may be performed during the formation of the plurality of gate lines 160; as a result, a height of each of the plurality of outer insulating spacers 118, the protective insulating film 142, and the inter-gate dielectric film 144 may be reduced.

Referring to FIG. 5Q, an interlayer insulating film 174 may be formed to at least partially cover the plurality of gate lines 160. Thereafter, the interlayer insulating film 174, the inter-gate dielectric film 144, and the protective insulating film 142 may be partially etched to form a plurality of contact holes 180 exposing the plurality of source/drain regions 134. A metal silicide film 182 may be formed on a top surface of each of the plurality of source/drain regions 134 exposed through the plurality of contact holes 180. Contact plugs 184 may be formed on the metal silicide film 182 to at least partially fill the contact holes 180. As a result, the IC device 100 shown in FIGS. 1, 2A, and 2B may be formed.

According to the method of manufacturing the IC device 100, which embodiments are described with reference to FIGS. 5A to 5Q, the IC device 100 in which the first nanosheet N1 closest to the fin top surface FT of the fin-type active region FA, from among the first to third nanosheets N1, N2, and N3 included in the nanosheet stack NSS, has a smallest length in the first horizontal direction (X direction) can be manufactured using a relatively simple method at relatively low manufacturing costs. Accordingly, even if a lower portion of each of the plurality of source/drain regions 134 has a higher resistance than an upper portion thereof because each of the plurality of source/drain regions 134 has a higher dopant concentration in upper vertical direction (Z direction) away from the substrate 102 or even if it is highly likely that the flow of current is concentrated on an upper nanosheet close to the contact plug 184, from among the first to third nanosheets N1, N2, and N3, in a turn-on state of the nanosheet transistor TR1, an effective channel length of a channel formed in the first nanosheet N1, which is close to a lower portion of the source/drain region 134 having a relatively high resistance and located farthest from the contact plug 184, may be reduced to reduce a resistance of the first nanosheet N1. Therefore, the amount of current flowing through the first nanosheet N1 may be increased at the same operating voltage. As a result, a deviation in the amount of current flowing through the first to third nanosheets N1, N2, and N3 may be reduced or minimized in a turn-on state of the nanosheet transistor TR1, and, thus, the performance of the IC device 100 may be improved or optimized in the turn-on state.

While methods of manufacturing the IC device 100 shown in FIGS. 1, 2A, and 2B, according to the example embodiments of the inventive concept, have been described above with reference to FIGS. 5A to 5Q, it will be understood that various changes and modifications in form and details may be made therein without departing from the spirit and scope of the inventive concept and IC devices having variously changed and modified structures may be manufactured from the descriptions presented with reference to FIGS. 5A to 5Q. For example, to manufacture the IC devices 200 and 300 shown in FIGS. 3 and 4, methods described with reference to FIGS. 5A to 5Q may be used. For example, portions of sidewalls of each of the first to third nanosheets N1, N2, and N3 exposed in an upper portion of the recess R1 may be etched using a similar method to the method of forming the first nanosheet indent region ND1 with reference to FIG. 5I and, thus, a plurality of indent regions, which may contain the first to third source/drain protruding regions 234P1, 234P2, and 234P3 shown in FIG. 3, or a plurality of indent regions, which may contain the first to third source/drain protruding regions 334P1, 334P2, and 334P3 shown in FIG. 4, may be formed. To this end, a type and a composition of an etchant included in an isotropic etching atmosphere, a temperature of an etching atmosphere, and the like may be adjusted according to a length to be removed from the sidewalls of each of the first to third nanosheets N1, N2, and N3 to control a desired etching amount of each of the first to third nanosheets N1, N2, and N3.

While the inventive concept has been particularly shown and described with reference to embodiments thereof, it will be understood that various changes in form and details may be made therein without departing from the spirit and scope of the following claims.

What is claimed is:

1. An integrated circuit device comprising:
    a fin-type active region extending lengthwise in a first direction;
    a plurality of nanosheets overlapping each other in a second direction on a fin top surface of the fin-type active region; and
    a source/drain region on the fin-type active region and facing the plurality of nanosheets in the first direction,
    wherein the plurality of nanosheets comprises a first nanosheet, which is closest to the fin top surface of the fin-type active region and has a shortest length in the first direction, from among the plurality of nanosheets, and
    wherein the source/drain region comprises a source/drain main region and a first source/drain protruding region protruding from the source/drain main region, wherein the first source/drain protruding region protrudes from the source/drain main region toward the first nanosheet to overlap portions of the plurality of nanosheets in the second direction,
    wherein the source/drain region comprises a first semiconductor layer doped with a first dopant of a first conductivity type,
    wherein the first nanosheet comprises a second semiconductor layer doped with a second dopant of the first conductivity type, and
    wherein nanosheets other than the first nanosheet, from among the plurality of nanosheets, comprise an undoped third semiconductor layer.

2. The integrated circuit device of claim 1, wherein the first nanosheet is configured to form a junctionless channel, and nanosheets other than the first nanosheet, from among the plurality of nanosheets, are each configured to form a channel based on a p-n junction.

3. The integrated circuit device of claim 1, wherein
the first nanosheet comprises a first compound semiconductor layer having a first composition, and
nanosheets other than the first nanosheet, from among the plurality of nanosheets, comprise a second compound semiconductor layer having a second composition different from the first composition.

4. The integrated circuit device of claim 1, wherein
the first nanosheet is configured to have a higher bandgap than nanosheets other than the first nanosheet, from among the plurality of nanosheets.

5. The integrated circuit device of claim 1, wherein
the first source/drain protruding region is in physical contact with the first nanosheet and defines a length of the first nanosheet in the first direction.

6. The integrated circuit device of claim 1, wherein
the plurality of nanosheets further comprise a second nanosheet and a third nanosheet, which are sequentially stacked on the first nanosheet,
wherein the second nanosheet and the third nanosheet have a same length in the first direction.

7. The integrated circuit device of claim 1, wherein
the plurality of nanosheets further comprise a second nanosheet and a third nanosheet, which are sequentially stacked on the first nanosheet,
wherein the second nanosheet and the third nanosheet have different lengths in the first direction.

8. The integrated circuit device of claim 7, wherein
the source/drain region further comprises a second source/drain protruding region, which protrudes from the source/drain main region toward any the second nanosheet or the third nanosheet,
wherein a length of the second source/drain protruding region is less than a length of the first source/drain protruding region in the first direction.

9. The integrated circuit device of claim 1, wherein
lengths of respective ones of the plurality of nanosheets in the first direction increase in a direction away from the fin top surface of the fin-type active region.

10. The integrated circuit device of claim 1, further comprising:
a gate structure comprising a main gate portion extending in a third direction planar with and intersecting the first direction on the plurality of nanosheets and a plurality of sub-gate portions connected to the main gate portion, the plurality of sub-gate portions being interleaved with the plurality of nanosheets on the fin top surface of the fin-type active region; and
a plurality of inner insulating spacers between the plurality of sub-gate portions and the source/drain main region, the plurality of inner insulating spacers overlapping the first source/drain protruding region in the second direction.

11. An integrated circuit device comprising:
a fin-type active region extending lengthwise in a first direction;
a pair of nanosheet stacks, each nanosheet stack comprising a plurality of nanosheets overlapping each other in a second direction on the fin-type active region; and
a source/drain region between the pair of nanosheet stacks on the fin-type active region,
wherein the plurality of nanosheets comprises a first nanosheet, which is closest to the fin-type active region from among the plurality of nanosheets and has a shortest length in the first direction,
wherein the source/drain region comprises a source/drain main region, which does not overlap the pair of nanosheet stacks in the second direction, and a pair of first source/drain protruding regions, which protrude in opposite directions from the source/drain main region toward the first nanosheet of each of the pair of nanosheet stacks,
wherein the plurality of nanosheets each comprise a compound semiconductor layer, and
wherein a composition of the compound semiconductor layer in a lowermost nanosheet closest to the fin-type active region, from among the plurality of nanosheets, is different from a composition of the compound semiconductor layer in ones of the plurality of nanosheets other than the lowermost nanosheet.

12. The integrated circuit device of claim 11, wherein
the plurality of nanosheets further comprise a second nanosheet having a greater length than the first nanosheet in the first direction,
the source/drain region further comprises a pair of second source/drain protruding regions, which protrude in opposite directions from the source/drain main region toward the second nanosheet of each of the pair of nanosheet stacks, and
a length of each of the pair of second source/drain protruding regions is less than a length of each of the pair of first source/drain protruding regions in the first direction.

13. The integrated circuit device of claim 11, wherein
the source/drain region and the first nanosheet are doped with a dopant of a same conductivity type.

14. The integrated circuit device of claim 11, wherein
each of the plurality of nanosheets comprises a silicon germanium (SiGe) layer,
wherein a Ge content ratio of the first nanosheet of the plurality of nanosheets is higher than respective Ge content ratios of ones of the plurality of nanosheets other than the first nanosheet.

15. The integrated circuit device of claim 11, wherein
each of the plurality of nanosheets comprises a Group III-V semiconductor layer comprising gallium (Ga),
wherein a Ga content ratio of the first nanosheet of the plurality of nanosheets is lower than respective Ga content ratios of ones of the plurality of nanosheets other than the first nanosheet.

16. An integrated circuit device comprising:
a fin-type active region extending lengthwise in a first direction;
a pair of source/drain regions on the fin-type active region; and
a plurality of nanosheets between the pair of source/drain regions and overlapping each other in a second direction on the fin-type active region,
wherein the plurality of nanosheets comprises a first nanosheet, a second nanosheet, and a third nanosheet, the second nanosheet and the third nanosheet have a same length in the first direction, and
wherein each of the pair of source/drain regions comprises at least one source/drain protruding region protruding toward the plurality of nanosheets.

17. The integrated circuit device of claim 16, wherein
a lowermost nanosheet closest to the fin-type active region, from among the plurality of nanosheets, is configured to form a junctionless channel, and nanosheets other than the lowermost nanosheet, from among the plurality of nanosheets, are each configured to form a channel based on a p-n junction.

18. The integrated circuit device of claim 16, wherein
the plurality of nanosheets each comprise a compound semiconductor layer, and
a composition of the compound semiconductor layer in a lowermost nanosheet closest to the fin-type active region, from among the plurality of nanosheets, is different from a composition of the compound semiconductor layer in ones of the plurality of nanosheets other than the lowermost nanosheet.

19. The integrated circuit device of claim 16, wherein
the first nanosheet is closer to the fin-type active region than the second nanosheet,
wherein the at least one source/drain protruding region comprises a first source/drain protruding region protruding toward the first nanosheet and a second source/drain protruding region protruding toward the second nanosheet, and a length of the first source/drain protruding region is greater than a length of the second source/drain protruding region in the first direction.

\* \* \* \* \*